US007728954B2

(12) United States Patent
Baselmans et al.

(10) Patent No.: US 7,728,954 B2
(45) Date of Patent: Jun. 1, 2010

(54) REFLECTIVE LOOP SYSTEM PRODUCING INCOHERENT RADIATION

(75) Inventors: Johannes Jacobus Matheus Baselmans, Oirschot (NL); Kenji Ueyama, Kyoto (JP)

(73) Assignee: ASML Netherlands B.V., Veldhoven (NL)

( * ) Notice: Subject to any disclaimer, the term of this patent is extended or adjusted under 35 U.S.C. 154(b) by 345 days.

(21) Appl. No.: 11/447,289

(22) Filed: Jun. 6, 2006

(65) Prior Publication Data
US 2007/0279611 A1  Dec. 6, 2007

(51) Int. Cl.
G03B 27/54 (2006.01)
H01S 3/10 (2006.01)
(52) U.S. Cl. .......................................... 355/67; 372/25
(58) Field of Classification Search .................... 355/53, 355/67; 372/25, 700
See application file for complete search history.

(56) References Cited

U.S. PATENT DOCUMENTS

| 4,511,220 | A |   | 4/1985  | Scully         |         |
|-----------|---|---|---------|----------------|---------|
| 4,619,508 | A |   | 10/1986 | Shibuya et al. |         |
| 4,744,615 | A |   | 5/1988  | Fan et al.     |         |
| 4,974,919 | A |   | 12/1990 | Muraki et al.  |         |
| 5,005,969 | A |   | 4/1991  | Kataoka        |         |
| 5,153,773 | A | * | 10/1992 | Muraki et al.  | 359/619 |
| 5,229,872 | A |   | 7/1993  | Mumola         |         |
| 5,296,891 | A |   | 3/1994  | Vogt et al.    |         |
| 5,309,456 | A | * | 5/1994  | Horton         | 372/25  |
| 5,363,170 | A |   | 11/1994 | Muraki         |         |
| 5,500,736 | A |   | 3/1996  | Koitabashi et al. |      |
| 5,523,193 | A |   | 6/1996  | Nelson         |         |
| 5,530,482 | A |   | 6/1996  | Gove et al.    |         |
| 5,579,147 | A |   | 11/1996 | Mori et al.    |         |
| 5,636,005 | A |   | 6/1997  | Yasuzato       |         |
| 5,636,006 | A |   | 6/1997  | Wu             |         |
| 5,677,703 | A |   | 10/1997 | Bhuva et al.   |         |
| 5,808,797 | A |   | 9/1998  | Bloom et al.   |         |
| 5,982,553 | A |   | 11/1999 | Bloom et al.   |         |
| 6,008,943 | A |   | 12/1999 | Metelitsa      |         |
| 6,133,986 | A |   | 10/2000 | Johnson        |         |
| 6,169,634 | B1 |  | 1/2001  | Sirat          |         |
| 6,177,980 | B1 |  | 1/2001  | Johnson        |         |
| 6,238,063 | B1 | * | 5/2001 | Tanitsu et al. | 362/268 |

(Continued)

FOREIGN PATENT DOCUMENTS

EP  1 521 110 A1  4/2005

(Continued)

OTHER PUBLICATIONS

European Search Report for Application No. 07252132.1-1524 completed Sep. 6, 2007, 10 pgs.

(Continued)

*Primary Examiner*—Georgia Y Epps
*Assistant Examiner*—Ryan Howard
(74) *Attorney, Agent, or Firm*—Sterne, Kessler, Goldstein & Fox P.L.L.C.

(57) ABSTRACT

A system and method are used to form incoherent beams from a coherent beam. A system comprises a source of radiation and a reflective loop system. The source of radiation produces a coherent or partially coherent beam. The reflective loop system received the partially coherent beam and reflects the partially coherent beam through a loop, or alternatively through non-overlapping loops, to form an incoherent beam.

29 Claims, 19 Drawing Sheets

U.S. PATENT DOCUMENTS

| | | |
|---|---|---|
| 6,310,679 B1 | 10/2001 | Shiraishi |
| 6,587,194 B2 | 7/2003 | Karpol et al. |
| 6,687,041 B1 | 2/2004 | Sandstrom |
| 6,747,783 B1 | 6/2004 | Sandstrom |
| 6,795,169 B2 | 9/2004 | Tanaka et al. |
| 6,806,897 B2 | 10/2004 | Kataoka et al. |
| 6,811,953 B2 | 11/2004 | Hatada et al. |
| 6,906,805 B1 | 6/2005 | Ina et al. |
| 7,035,012 B2 * | 4/2006 | Govorkov et al. ............ 359/618 |
| 2002/0015156 A1 | 2/2002 | Ina et al. |
| 2002/0126479 A1 | 9/2002 | Zhai et al. |
| 2003/0147082 A1 | 8/2003 | Goldstein |
| 2003/0197858 A1 * | 10/2003 | Karpol et al. ............ 356/237.2 |
| 2004/0041104 A1 | 3/2004 | Liebregts et al. |
| 2004/0130561 A1 | 7/2004 | Jain |
| 2004/0179364 A1 * | 9/2004 | Burkhardt et al. ............ 362/298 |
| 2005/0007572 A1 | 1/2005 | George et al. |
| 2005/0036197 A1 | 2/2005 | Awamura |
| 2005/0207160 A1 | 9/2005 | Babayoff et al. |
| 2005/0226556 A1 | 10/2005 | Kanoshita et al. |

FOREIGN PATENT DOCUMENTS

| | | | |
|---|---|---|---|
| EP | 1 521 111 A1 | 4/2005 | |
| JP | 59 226317 A2 | 12/1984 | |
| JP | 1 114035 A2 | 5/1989 | |
| JP | 1 295215 A2 | 11/1989 | |
| JP | 6 244082 A2 | 9/1994 | |
| JP | 7-297111 A | 11/1995 | |
| JP | 10 012542 A2 | 1/1998 | |
| JP | 11 204432 A2 | 7/1999 | |
| JP | 2000/244050 A2 | 9/2000 | |
| JP | 2001/021448 A2 | 1/2001 | |
| JP | 2001-274081 A | 10/2001 | |
| JP | 2002/022410 A2 | 1/2002 | |
| JP | 2003/133210 A2 | 5/2003 | |
| WO | WO 98/33096 | 7/1998 | |
| WO | WO 98/38597 | 9/1998 | |
| WO | WO 01/57581 A | 8/2001 | |

OTHER PUBLICATIONS

Notification of Reason for Refusal mailed Mar. 2, 2010 for Japanese Patent Application No. 2007-150014, 2 pgs.

* cited by examiner

REFLECTIVE LOOP SYSTEM PRODUCING INCOHERENT RADIATION

BACKGROUND

1. Field of the Invention

The present invention relates to radiation systems.

2. Related Art

A lithographic apparatus is a machine that applies a desired pattern onto a substrate or part of a substrate. A lithographic apparatus can be used, for example, in the manufacture of flat panel displays, integrated circuits (ICs) and other devices involving fine structures. In a conventional apparatus, a patterning device, which can be referred to as a mask or a reticle, can be used to generate a circuit pattern corresponding to an individual layer of a flat panel display (or other device). This pattern can be transferred onto all or part of the substrate (e.g., a glass plate), by imaging onto a layer of radiation-sensitive material (e.g., resist) provided on the substrate.

Instead of a circuit pattern, the patterning device can be used to generate other patterns, for example a color filter pattern or a matrix of dots. Instead of a mask, the patterning device can comprise a patterning array that comprises an array of individually controllable elements. The pattern can be changed more quickly and for less cost in such a system compared to a mask-based system.

A flat panel display substrate is typically rectangular in shape. Lithographic apparatus designed to expose a substrate of this type can provide an exposure region that covers a full width of the rectangular substrate, or covers a portion of the width (for example half of the width). The substrate can be scanned underneath the exposure region, while the mask or reticle is synchronously scanned through a beam. In this way, the pattern is trasiferred to the substrate. If the exposure region covers the full width of the substrate then exposure can be completed with a single scan. If the exposure region covers, for example, half of the width of the substrate, then the substrate can be moved transversely after the first scan, and a further scan is typically performed to expose the remainder of the substrate.

Typically, lithography systems use lasers as radiation sources to produce an illumination beam, e.g., a coherent illumination beam or a partially coherent illumination beam. During its travel through the lithography system, the illumination beam may reflect from components in the lithography system, which can form scattered light. The scattered light can interfere with the illuminating beam causing speckle patterns in an image. The speckle patterns are undesirable because they can cause errors in a pattern formed on a substrate. The speckle patterns can be caused by interference of partially coherent beams that are subject to minute temporal and spatial fluctuations. The speckle patterns are sometimes referred to as noise-like characteristics of the (partial) coherent illumination beam. Speckle patterns can also be caused when an element that increases angular distribution is used because multiple coherent copies of the beam are made. The multiple coherent copies of the beam can interfere with each other when an optical path difference between the different coherent copies (e.g., between generation of the beams and detection of the beams) is small compared to a coherence length (e.g., transverse and temporal) of the beams.

Conventionally, the speckle patterns have been compensated for through use of a diffractive or refractive optical element positioned after the laser, which are used to form an incoherent beam from the coherent beam. These elements are sometimes referred to as "coherence busting elements." As discussed above, the incoherent beam comprises multiple copies of the coherent beam.

The speckle pattern can be further reduced through movement of the optical element with respect to the illumination beam. The movement of the optical element changes a phase distribution for each copy of the coherent beams, which changes the speckle pattern for set of copies of the coherent beam. Through integrating (e.g., summing) of all the speckle patterns, uniform light is produced. However, a significant movement of the optical element is needed to substantially eliminate the speckle patterns. Also, typically the significant movement must be done within a short period of time, for example an exposure time. In an example where 30 pulses are used from a 1000 Hz laser, the exposure time could be about 30 µs. The significant movement in this short period of time can cause large oscillations within the lithography system, including high acceleration and jerks. The high acceleration and jerks can cause problems within the lithography system. Also, due to typically limited integration time, e.g., about 50 ns per pulse, it becomes nearly impossible to move the optical element enough with respect to the beam to substantially eliminate the speckle patterns.

Another way of compensating for the speckle patterns is to use a large number of laser pulses, e.g., 60 laser pulses, during each exposure cycle. A different speckle pattern results from each laser pulse. Thus, through use of a large number of laser pulses, the speckle patterns can be averaged out over time. However, recent lithography systems have decreased the number of laser pulses and/or have reduced the duration of each laser pulse during each exposure cycle. Unfortunately, reducing the number of laser pulses during each exposure cycle may not allow for the averaging effect to occur. Further, it may be difficult to move an optical element an acceptable amount during a reduced laser pulse duration to allow for compensation of the speckle patterns.

Therefore, what is needed is a system and method that produces incoherent radiation having uniform intensity.

SUMMARY

In one embodiment of the present invention, there is provided a system comprising a source of radiation and a reflective loop system. The source of radiation produces a coherent or partially coherent beam. The reflective loop system is configured to receive the at least partially coherent beam and reflect the partially coherent beam through a loop, or alternatively through non-overlapping loops, to form a more incoherent beam.

Additionally, or alternatively, the system can be a laser. Additionally, or alternatively, the system can be an illuminator.

Additionally, or alternatively, two or more reflective loop systems can be optically coupled in series.

Additionally, or alternatively, the system can be located within a lithography system, which includes a patterning device and a projection system. In this example, an illumination beam is formed from the incoherent beam. The illumination beam is directed to be patterned by the patterning device, and the projection system projects the patterned beam onto a substrate.

In another embodiment, there is provided a device manufacturing method. A coherent or partially coherent beam is reflected through a loop, or alternatively non-overlapping loops, to form a more incoherent beam. An illumination beam is formed from the incoherent beam. The illumination beam is patterned. The patterned illumination beam is projected onto a target portion of a substrate.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate one or more embodiments of the present invention and, together with the description, further serve to explain the principles of the invention and to enable a person skilled in the pertinent art to make and use the invention.

Figure 5:
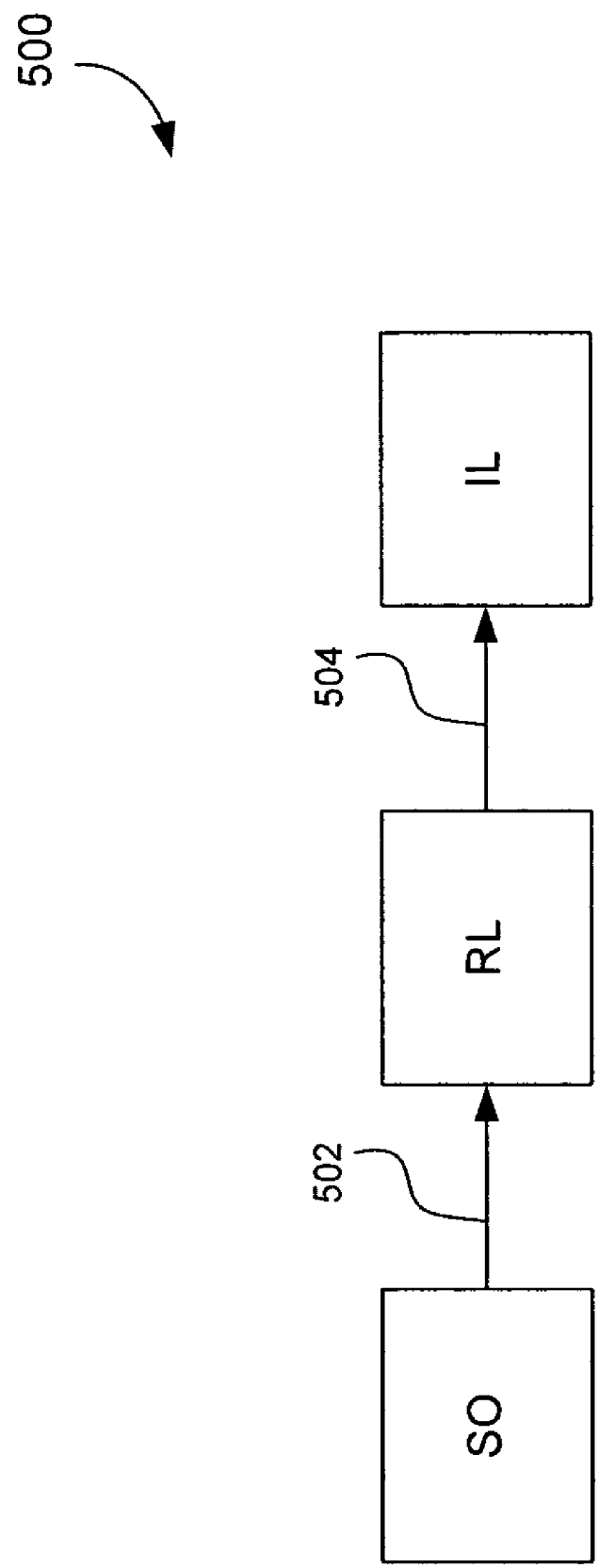
Figure 6:
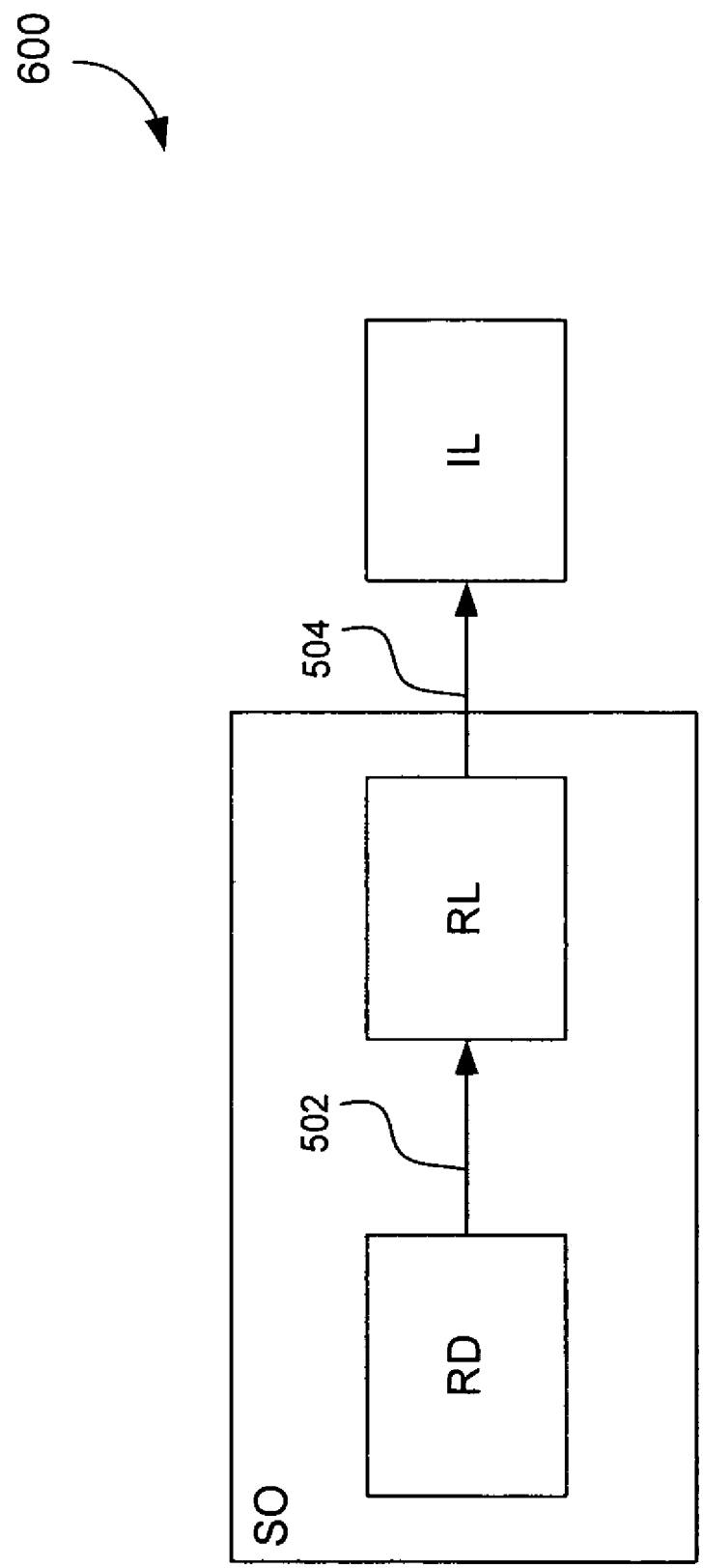
Figure 7:
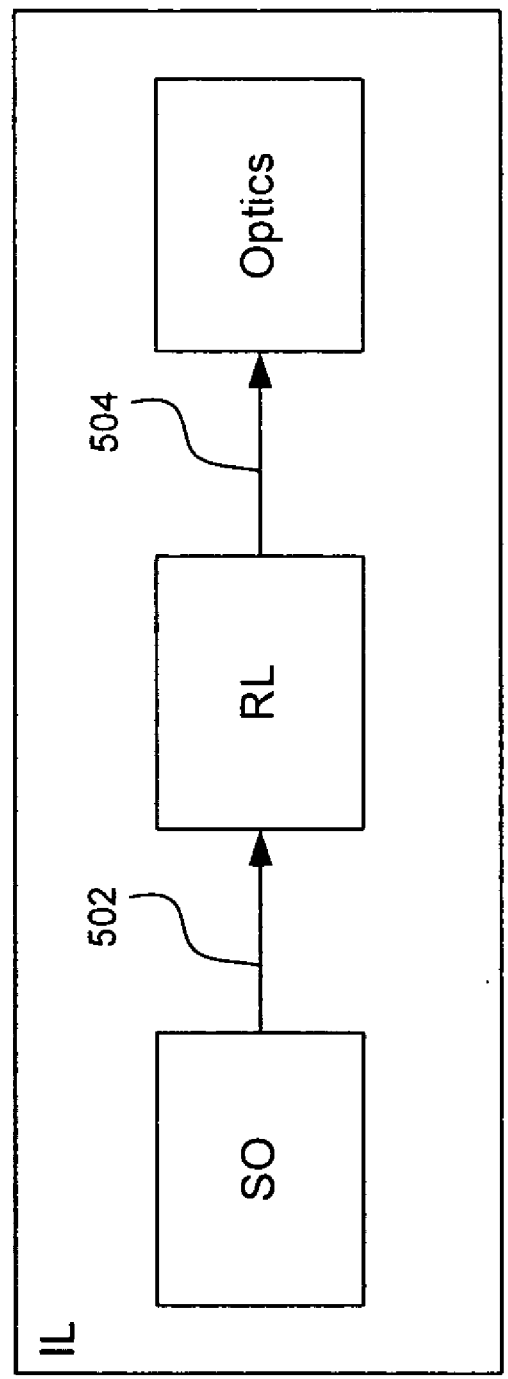

FIGS. 5, 6, and 7 show various radiation producing arrangements including a reflective loops system, according to various embodiments of the present invention.

Figure 8:
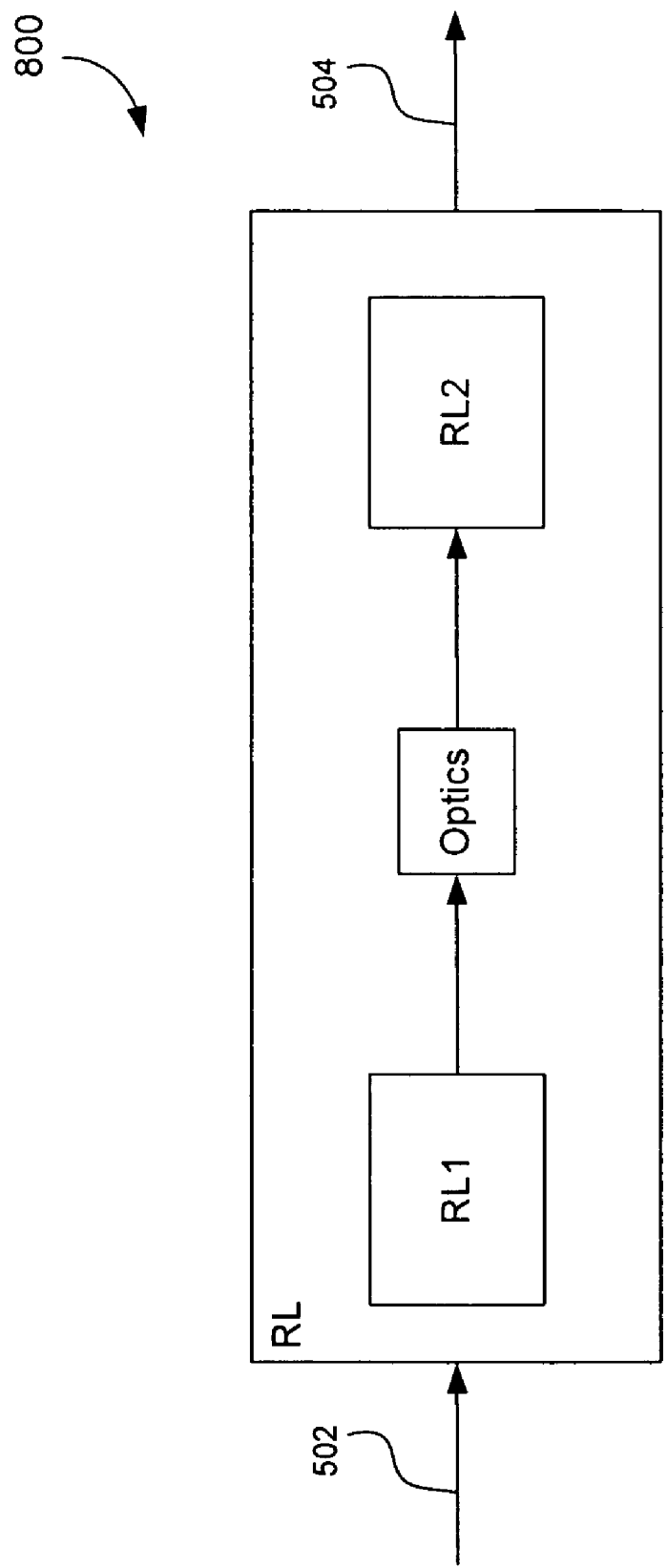

FIG. 8 shows a reflective loop system including a first reflective loop system and a second reflective loop system, according to one embodiment of the present invention FIGS. 9, 10, 11, 12, 13, 14, 15, 16, and 17 show various configurations for a reflective loop system, according to various embodiments of the present invention.

Figure 18:
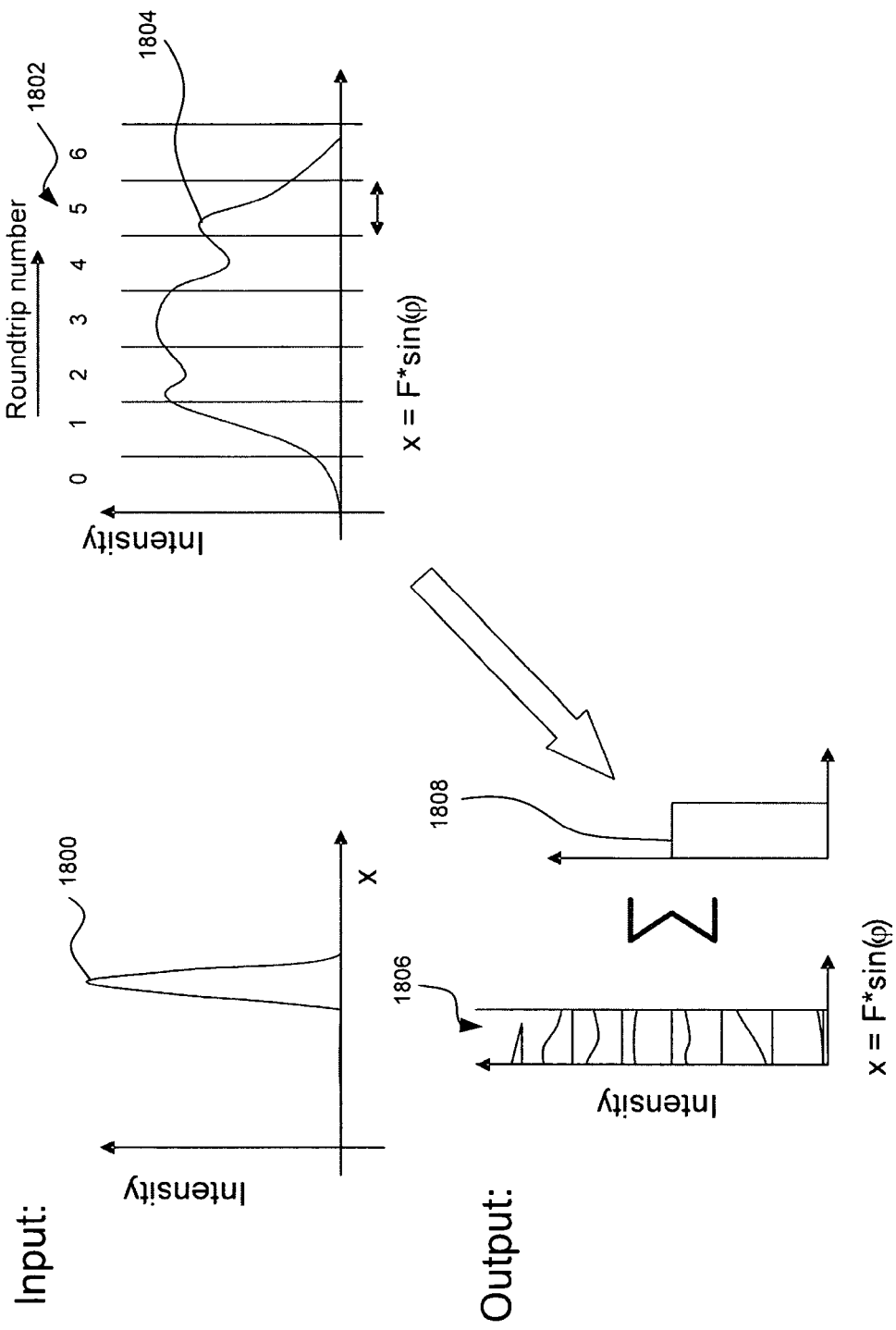

FIG. 18 graphically depicts entrance and exit illumination intensity distribution for a reflective loop system, according to one embodiment of the present invention.

Figure 19:
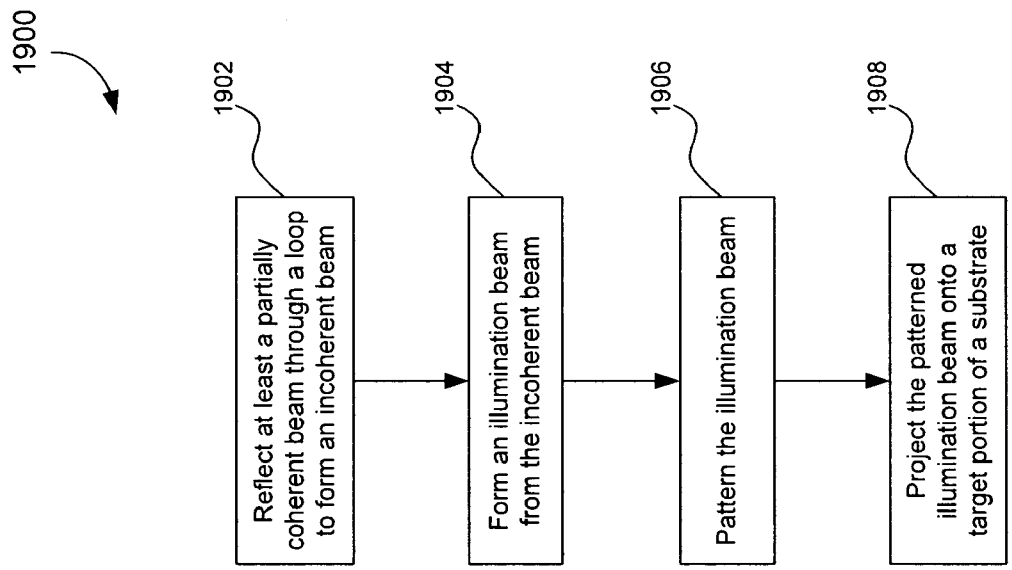

FIG. 19 is a flowchart depicting a method, according to one embodiment of the present invention.

One or more embodiments of the present invention will now be described with reference to the accompanying drawings. In the drawings, like reference numbers can indicate identical or functionally similar elements. Additionally, the left-most digit(s) of a reference number can identify the drawing in which the reference number first appears.

DETAILED DESCRIPTION

In one or more embodiments, a system and method are used to form more incoherent beams from a (partially) coherent beam. A system comprises a source of radiation and a reflective loop system. The source of radiation produces coherent or partially coherent beam. The reflective loop system receives the (partially) coherent beam and reflects the beam through a loop, or alternatively through non-overlapping loops, to form an more incoherent beam. In one example, through production of an incoherent beam in this configuration, no coherent part of the illumination beams interferes with other coherent parts of the illumination, such that no speckle is produced.

Throughout the specification, the processing of coherent laser beams is equally applicable to processing of partial coherent beams, or vice versa, such as beams that contain multiple modes (e.g., transverse and temporal). Thus, the scope of the various embodiments of the present invention are contemplated to cover various types of beams.

While specific configurations and arrangements are discussed, it should be understood that this is done for illustrative purposes only. A person skilled in the pertinent art will recognize that other configurations and arrangements can be used without departing from the spirit and scope of the present invention. It will be apparent to a person skilled in the pertinent art that this invention can also be employed in a variety of other applications.

Figure 1:
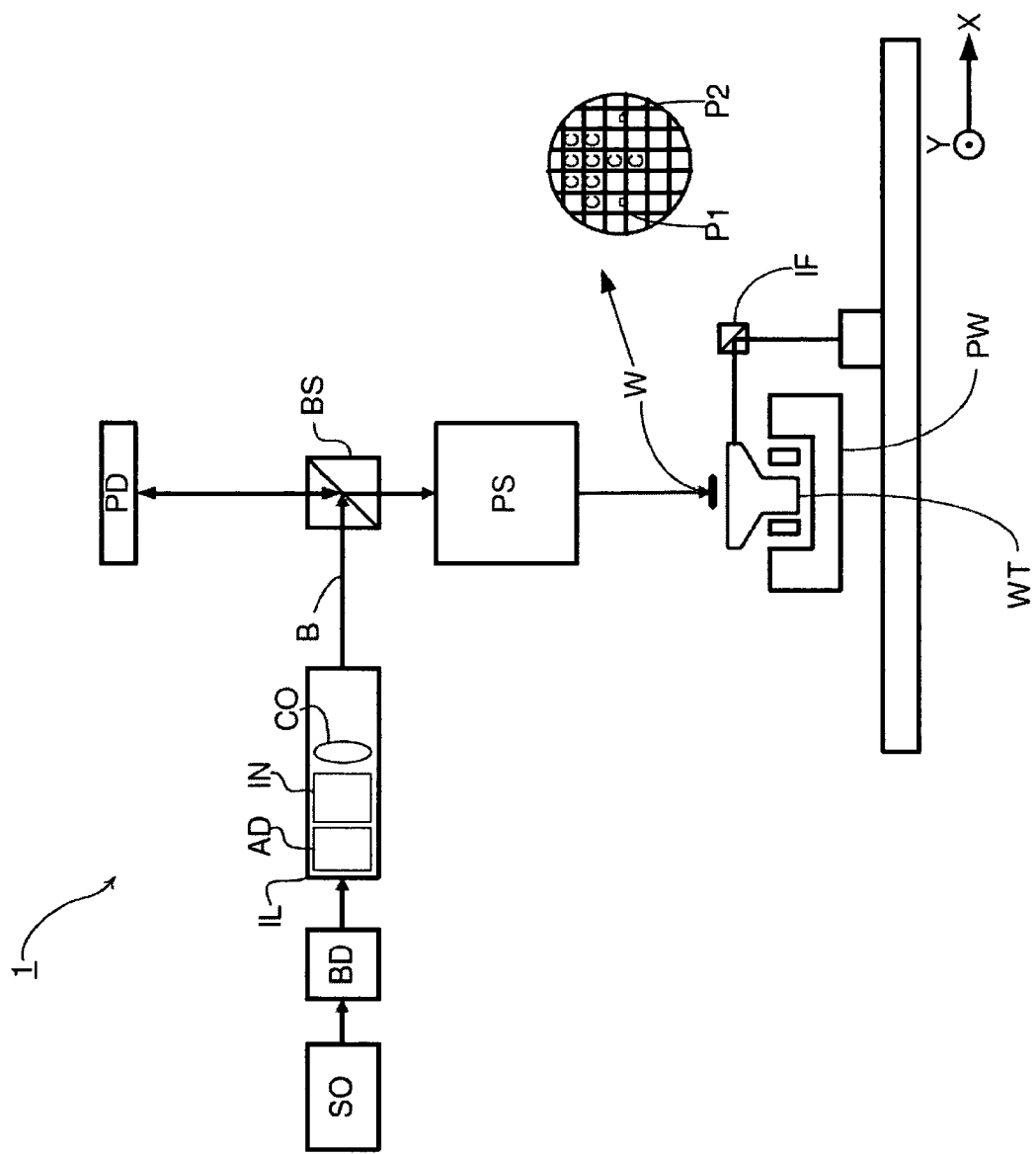
FIGS. 1 and 2 depict lithographic apparatus, according to various embodiments of the present invention.

FIG. 1 schematically depicts the lithographic apparatus 1 of one embodiment of the invention. The apparatus comprises an illumination system IL, a patterning device PD, a substrate table WT, and a projection system PS. The illumination system (illuminator) IL is configured to condition a radiation beam B (e.g., UV radiation).

The patterning device PD (e.g., a reticle or mask or an array of individually controllable elements) modulates the beam. In general, the position of the array of individually controllable elements will be fixed relative to the projection system PS. However, it can instead be connected to a positioner configured to accurately position the array of individually controllable elements in accordance with certain parameters.

The substrate table WT is constructed to support a substrate (e.g., a resist-coated substrate) W and connected to a positioner PW configured to accurately position the substrate in accordance with certain parameters.

The projection system (e.g., a refractive projection lens system) PS is configured to project the beam of radiation modulated by the array of individually controllable elements onto a target portion C (e.g., comprising one or more dies) of the substrate W.

The illumination system can include various types of optical components, such as refractive, reflective, magnetic, electromagnetic, electrostatic or other types of optical components, or any combination thereof, for directing, shaping, or controlling radiation.

The term "patterning device" or "contrast device" used herein should be broadly interpreted as referring to any device that can be used to modulate the cross-section of a radiation beam, such as to create a pattern in a target portion of the substrate. The devices can be either static patterning devices (e.g., masks or reticles) or dynamic (e.g., arrays of programmable elements) patterning devices. For brevity, most of the description will be in terms of a dynamic patterning device, however it is to be appreciated that a static pattern device can also be used without departing from the scope of the present invention.

It should be noted that the pattern imparted to the radiation beam may not exactly correspond to the desired pattern in the target portion of the substrate, for example if the pattern includes phase-shifting features or so called assist features. Similarly, the pattern eventually generated on the substrate may not correspond to the pattern formed at any one instant on the array of individually controllable elements. This can be the case in an arrangement in which the eventual pattern formed on each part of the substrate is built up over a given period of time or a given number of exposures during which the pattern on the array of individually controllable elements and/or the relative position of the substrate changes.

Generally, the pattern created on the target portion of the substrate will correspond to a particular functional layer in a device being created in the target portion, such as an integrated circuit or a flat panel display (e.g., a color filter layer in a flat panel display or a thin film transistor layer in a flat panel display). Examples of such patterning devices include, e.g., reticles, programmable mirror arrays, laser diode arrays, light emitting diode arrays, grating light valves, and LCD arrays.

Patterning devices whose pattern is programmable with the aid of electronic means (e.g., a computer), such as patterning devices comprising a plurality of programmable elements (e.g., all the devices mentioned in the previous sentence except for the reticle), are collectively referred to herein as "contrast devices." In one example, the patterning device comprises at least 10 programmable elements, e.g., at least 100, at least 1,000, at least 10,000, at least 100,000, at least 1,000,000, or at least 10,000,000 programmable elements.

A programmable mirror array can comprise a matrix-addressable surface having a viscoelastic control layer and a reflective surface. The basic principle behind such an apparatus is that, e.g., addressed areas of the reflective surface reflect incident light as diffracted light, whereas unaddressed areas reflect incident light as undiffracted light. Using an appropriate spatial filter, the undiffracted light can be filtered out of the reflected beam, leaving only the diffracted light to reach the substrate. In this manner, the beam becomes patterned according to the addressing pattern of the matrix-addressable surface.

It will be appreciated that, as an alternative, the filter can filter out the diffracted light, leaving the undiffracted light to reach the substrate.

An array of diffractive optical MEMS devices (micro-electro-mechanical system devices) can also be used in a corresponding manner. In one example, a diffractive optical MEMS device is comprised of a plurality of reflective ribbons that can be deformed relative to one another to form a grating that reflects incident light as diffracted light.

A further alternative example of a programmable mirror array employs a matrix arrangement of tiny mirrors, each of which can be individually tilted about an axis by applying a suitable localized electric field, or by employing piezoelectric actuation means. Once again, the mirrors are matrix-addressable, such that addressed mirrors reflect an incoming radiation beam in a different direction to unaddressed mirrors; in this manner, the reflected beam can be patterned according to the addressing pattern of the matrix-addressable mirrors. The required matrix addressing can be performed using suitable electronic means.

Another example PD is a programmable LCD array.

The lithographic apparatus can comprise one or more contrast devices. For example, it can have a plurality of arrays of individually controllable elements, each controlled independently of each other. In such an arrangement, some or all of the arrays of individually controllable elements can have at least one of a common illumination system (or part of an illumination system), a common support structure for the arrays of individually controllable elements, and/or a common projection system (or part of the projection system).

In an example, such as the embodiment depicted in FIG. 1, the substrate W has a substantially circular shape, optionally with a notch and/or a flattened edge along part of its perimeter. In an example, the substrate has a polygonal shape, e.g., a rectangular shape.

Examples where the substrate has a substantially circular shape include examples where the substrate has a diameter of at least 25 mm, for instance at least 50 mm, at least 75 mm, at least 100 mm, at least 125 mm, at least 150 mm, at least 175 mm, at least 200 mm, at least 250 mm, or at least 300 mm. In one embodiment, the substrate has a diameter of at most 500 mm, at most 400 mm, at most 350 mm, at most 300 mm, at most 250 mm, at most 200 mm, at most 150 mm, at most 100 mm, or at most 75 mm.

Examples where the substrate is polygonal, e.g., rectangular, include examples where at least one side, e.g., at least 2 sides or at least 3 sides, of the substrate has a length of at least 5 cm, e.g., at least 25 cm, at least 50 cm, at least 100 cm, at least 150 cm, at least 200 cm, or at least 250 cm.

In one example, at least one side of the substrate has a length of at most 1000 cm, e.g., at most 750 cm, at most 500 cm, at most 350 cm, at most 250 cm, at most 150 cm, or at most 75 cm.

In one example, the substrate W is a wafer, for instance a semiconductor wafer. In one example, the wafer material is selected from the group consisting of Si, SiGe, SiGeC, SiC, Ge, GaAs, InP, and InAs. The wafer may be: a III/V compound semiconductor wafer, a silicon wafer, a ceramic substrate, a glass substrate, or a plastic substrate. The substrate may be transparent (for the naked human eye), colored, or absent a color.

The thickness of the substrate can vary and, to an extent, can depend, e.g., on the substrate material and/or the substrate dimensions. In one example, the thickness is at least 50 µm, e.g., at least 100 µm, at least 200 µm, at least 300 µm, at least 400 µm, at least 500 µm, or at least 600 µm. The thickness of the substrate may be at most 5000 µm, e.g., at most 3500 µm, at most 2500 µm, at most 1750 µm, at most 1250 µm, at most 1000 µm, at most 800 µm, at most 600 µm, at most 500 µm, at most 400 µm, or at most 300 µm.

The substrate referred to herein can be processed, before or after exposure, in for example a track (a tool that typically applies a layer of resist to a substrate and develops the exposed resist), a metrology tool, and/or an inspection tool. In one example, a resist layer is provided on the substrate.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein can be considered as synonymous with the more general term "projection system."

The projection system can image the pattern on the array of individually controllable elements, such that the pattern is coherently formed on the substrate. Alternatively, the projection system can image secondary sources for which the elements of the array of individually controllable elements act as shutters. In this respect, the projection system can comprise an array of focusing elements such as a micro lens array (known as an MLA) or a Fresnel lens array, e.g., to form the secondary sources and to image spots onto the substrate. In one example, the array of focusing elements (e.g., MLA) comprises at least 10 focus elements, e.g., at least 100 focus elements, at least 1,000 focus elements, at least 10,000 focus elements, at least 100,000 focus elements, or at least 1,000,000 focus elements. In one example, the number of individually controllable elements in the patterning device is equal to or greater than the number of focusing elements in the array of focusing elements. In one example, one or more (e.g., 1,000 or more, the majority, or about each) of the focusing elements in the array of focusing elements can be optically associated with one or more of the individually controllable elements in the array of individually controllable elements, e.g., with 2 or more of the individually controllable elements in the array of individually controllable elements, such as 3 or more, 5 or more, 10 or more, 20 or more, 25 or more, 35 or more, or 50 or more. In one example, the MLA is movable (e.g., with the use of one or more actuators) at least in the direction to and away from the substrate. Being able to move the MLA to and away from the substrate allows, e.g., for focus adjustment without having to move the substrate.

Figure 2:
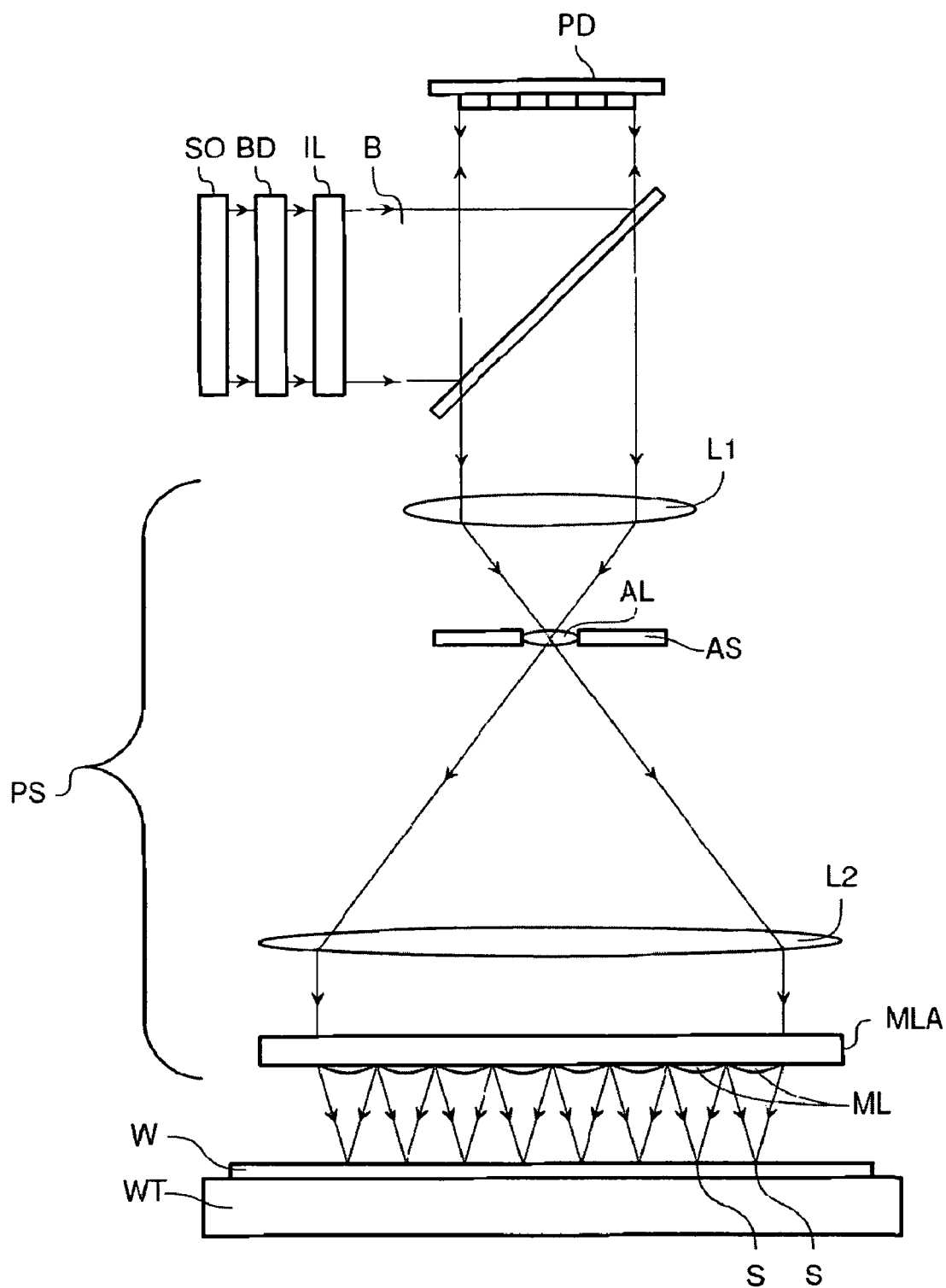

As herein depicted in FIGS. 1 and 2, the apparatus is of a reflective type (e.g., employing a reflective array of individually controllable elements). Alternatively, the apparatus can be of a transmission type (e.g., employing a transmission array of individually controllable elements).

The lithographic apparatus can be of a type having two (dual stage) or more substrate tables. In such "multiple stage" machines, the additional tables can be used in parallel, or preparatory steps can be carried out on one or more tables while one or more other tables are being used for exposure.

The lithographic apparatus can also be of a type wherein at least a portion of the substrate can be covered by an "immersion liquid" having a relatively high refractive index, e.g., water, so as to fill a space between the projection system and the substrate. An immersion liquid can also be applied to other spaces in the lithographic apparatus, for example, between the patterning device and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring again to FIG. 1, the illuminator IL receives a radiation beam from a radiation source SO. In one example, the radiation source provides radiation having a wavelength of at least 5 nm, e.g., at least 10 nm, at least 11-13 nm, at least 50 nm, at least 100 nm, at least 150 nm, at least 175 nm, at least 200 nm, at least 250 nm, at least 275 nm, at least 300 nm, at least 325 nm, at least 350 nm, or at least 360 nm. In one example, the radiation provided by radiation source SO has a wavelength of at most 450 nm, e.g., at most 425 nm, at most 375 nm, at most 360 nm, at most 325 nm, at most 275 nm, at most 250 nm, at most 225 nm, at most 200 nm, or at most 175 nm. In one example, the radiation has a wavelength including 436 nm, 405 nm, 365 nm, 355 nm, 248 nm, 193 nm, 157 nm, and/or 126 nm. In one example, the radiation includes a wavelength of around 365 nm or around 355 nm. In one example, the radiation includes a broad band of wavelengths, for example encompassing 365, 405, and 436 nm. A 355 nm laser source could be used. The source and the lithographic apparatus can be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source can be an integral part of the lithographic apparatus, for example when the source is a mercury lamp. The source SO and the illuminator IL, together with the beam delivery system BD if required, can be referred to as a radiation system.

The illuminator IL, can comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL can comprise various other components, such as an integrator IN and a condenser CO. The illuminator can be used to condition the radiation beam to have a desired uniformity and intensity distribution in its cross-section. The illuminator IL, or an additional component associated with it, can also be arranged to divide the radiation beam into a plurality of sub-beams that can, for example, each be associated with one or a plurality of the individually controllable elements of the array of individually controllable elements. A two-dimensional diffraction grating can, for example, be used to divide the radiation beam into sub-beams. In the present description, the terms "beam of radiation" and "radiation beam" encompass, but are not limited to, the situation in which the beam is comprised of a plurality of such sub-beams of radiation.

The radiation beam B is incident on the patterning device PD (e.g., an array of individually controllable elements) and is modulated by the patterning device. Having been reflected by the patterning device PD, the radiation beam B passes through the projection system PS, which focuses the beam onto a target portion C of the substrate W. With the aid of the positioner PW and position sensor IF (e.g., an interferometric device, linear encoder, capacitive sensor, or the like), the substrate table WT can be moved accurately, e.g., so as to position different target portions C in the path of the radiation beam B. Where used, the positioning means for the array of individually controllable elements can be used to correct accurately the position of the patterning device PD with respect to the path of the beam B, e.g., during a scan.

In one example, movement of the substrate table WT is realized with the aid of a long-stroke module (course positioning) and a short-stroke module (fine positioning), which are not explicitly depicted in FIG. 1. In another example, a short stroke stage may not be present. A similar system can also be used to position the array of individually controllable elements. It will be appreciated that the beam B can alternatively/additionally be moveable, while the object table and/or the array of individually controllable elements can have a fixed position to provide the required relative movement. Such an arrangement can assist in limiting the size of the apparatus. As a further alternative, which can, e.g., be applicable in the manufacture of flat panel displays, the position of the substrate table WT and the projection system PS can be fixed and the substrate W can be arranged to be moved relative to the substrate table WT. For example, the substrate table WT can be provided with a system for scanning the substrate W across it at a substantially constant velocity.

As shown in FIG. 1, the beam of radiation B can be directed to the patterning device PD by means of a beam splitter BS configured such that the radiation is initially reflected by the beam splitter and directed to the patterning device PD. It should be realized that the beam of radiation B can also be directed at the patterning device without the use of a beam splitter. In one example, the beam of radiation is directed at the patterning device at an angle between 0 and 90°, e.g., between 5 and 85°, between 15 and 75°, between 25 and 65°, or between 35 and 55° (the embodiment shown in FIG. 1 is at a 90° angle). The patterning device PD modulates the beam of radiation B and reflects it back to the beam splitter BS which transmits the modulated beam to the projection system PS. It will be appreciated, however, that alternative arrangements can be used to direct the beam of radiation B to the patterning device PD and subsequently to the projection system PS. In particular, an arrangement such as is shown in FIG. 1 may not be required if a transmission patterning device is used.

The depicted apparatus can be used in several modes:

1. In step mode, the array of individually controllable elements and the substrate are kept essentially stationary, while an entire pattern imparted to the radiation beam is projected onto a target portion C at one go (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the array of individually controllable elements and the substrate are scanned synchronously while a pattern imparted to the radiation beam is projected onto a target portion C (i.e., a single dynamic exposure). The velocity and direction of the substrate relative to the array of individually controllable elements can be determined by the (de-) magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In pulse mode, the array of individually controllable elements is kept essentially stationary and the entire pattern is projected onto a target portion C of the substrate W using a pulsed radiation source. The substrate table WT is moved with an essentially constant speed such that the beam B is caused to scan a line across the substrate W. The pattern on the array of individually controllable elements is updated as required between pulses of the radiation system and the pulses are timed such that successive target portions C are exposed at the required locations on the substrate W. Consequently, the beam B can scan across the substrate W to expose the complete pattern for a strip of the substrate. The process is repeated until the complete substrate W has been exposed line by line.

4. Continuous scan mode is essentially the same as pulse mode except that the substrate W is scanned relative to the modulated beam of radiation B at a substantially constant speed and the pattern on the array of individually controllable elements is updated as the beam B scans across the substrate W and exposes it. A substantially constant radiation source or a pulsed radiation source, synchronized to the updating of the pattern on the array of individually controllable elements, can be used.

5. In pixel grid imaging mode, which can be performed using the lithographic apparatus of FIG. 2, the pattern formed on substrate W is realized by subsequent exposure of spots formed by a spot generator that are directed onto patterning device PD. The exposed spots have substantially the same shape. On substrate W the spots are printed in substantially a grid. In one example, the spot size is larger than a pitch of a printed pixel grid, but much smaller than the exposure spot grid. By varying intensity of the spots printed, a pattern is realized. In between the exposure flashes the intensity distribution over the spots is varied.

Combinations and/or variations on the above described modes of use or entirely different modes of use can also be employed.

In lithography, a pattern is exposed on a layer of resist on the substrate. The resist is then developed. Subsequently, additional processing steps are performed on the substrate. The effect of these subsequent processing steps on each portion of the substrate depends on the exposure of the resist. In particular, the processes are tuned such that portions of the substrate that receive a radiation dose above a given dose threshold respond differently to portions of the substrate that receive a radiation dose below the dose threshold. For example, in an etching process, areas of the substrate that receive a radiation dose above the threshold are protected from etching by a layer of developed resist. However, in the post-exposure development, the portions of the resist that receive a radiation dose below the threshold are removed and therefore those areas are not protected from etching. Accordingly, a desired pattern can be etched. In particular, the individually controllable elements in the patterning device are set such that the radiation that is transmitted to an area on the substrate within a pattern feature is at a sufficiently high intensity that the area receives a dose of radiation above the dose threshold during the exposure. The remaining areas on the substrate receive a radiation dose below the dose threshold by setting the corresponding individually controllable elements to provide a zero or significantly lower radiation intensity.

In practice, the radiation dose at the edges of a pattern feature does not abruptly change from a given maximum dose to zero dose even if the individually controllable elements are set to provide the maximum radiation intensity on one side of the feature boundary and the minimum radiation intensity on the other side. Instead, due to diffractive effects, the level of the radiation dose drops off across a transition zone. The position of the boundary of the pattern feature ultimately formed by the developed resist is determined by the position at which the received dose drops below the radiation dose threshold. The profile of the drop-off of radiation dose across the transition zone, and hence the precise position of the pattern feature boundary, can be controlled more precisely by setting the individually controllable elements that provide radiation to points on the substrate that are on or near the pattern feature boundary. These can be not only to maximum or minimum intensity levels, but also to intensity levels between the maximum and minimum intensity levels. This is commonly referred to as "grayscaling."

Grayscaling provides greater control of the position of the pattern feature boundaries than is possible in a lithography system in which the radiation intensity provided to the substrate by a given individually controllable element can only be set to two values (e.g., just a maximum value and a minimum value). In one embodiment, at least three different radiation intensity values can be projected onto the substrate, e.g., at least 4 radiation intensity values, at least 8 radiation intensity values, at least 16 radiation intensity values, at least 32 radiation intensity values, at least 64 radiation intensity values, at least 128 radiation intensity values, or at least 256 radiation intensity values.

It should be appreciated that grayscaling can be used for additional or alternative purposes to that described above. For example, the processing of the substrate after the exposure can be tuned, such that there are more than two potential responses of regions of the substrate, dependent on received radiation dose level. For example, a portion of the substrate receiving a radiation dose below a first threshold responds in a first manner; a portion of the substrate receiving a radiation dose above the first threshold but below a second threshold responds in a second manner; and a portion of the substrate receiving a radiation dose above the second threshold responds in a third manner. Accordingly, grayscaling can be used to provide a radiation dose profile across the substrate having more than two desired dose levels. In one embodiment, the radiation dose profile has at least 2 desired dose levels, e.g., at least 3 desired radiation dose levels, at least 4 desired radiation dose levels, at least 6 desired radiation dose levels or at least 8 desired radiation dose levels.

It should further be appreciated that the radiation dose profile can be controlled by methods other than by merely controlling the intensity of the radiation received at each point on the substrate, as described above. For example, the radiation dose received by each point on the substrate can alternatively or additionally be controlled by controlling the duration of the exposure of the point. As a further example, each point on the substrate can potentially receive radiation in a plurality of successive exposures. The radiation dose received by each point can, therefore, be alternatively or additionally controlled by exposing the point using a selected subset of the plurality of successive exposures.

In order to form the required pattern on the substrate, it is necessary to set each of the individually controllable elements in the patterning device to the requisite state at each stage during the exposure process. Therefore, control signals, representing the requisite states, must be transmitted to each of the individually controllable elements. In one example, the lithographic apparatus includes a controller that generates the control signals. The pattern to be formed on the substrate can be provided to the lithographic apparatus in a vector-defined format, such as GDSII. In order to convert the design information into the control signals for each individually controllable element, the controller includes one or more data manipulation devices, each configured to perform a processing step on a data stream that represents the pattern. The data manipulation devices can collectively be referred to as the "datapath."

The data manipulation devices of the datapath can be configured to perform one or more of the following functions: converting vector-based design information into bitmap pattern data; converting bitmap pattern data into a required radiation dose map (e.g., a required radiation dose profile across the substrate); converting a required radiation dose map into required radiation intensity values for each individually controllable element; and converting the required radiation intensity values for each individually controllable element into corresponding control signals.

FIG. 2 depicts an arrangement of the apparatus according to the present invention that can be used, e.g., in the manufacture of flat panel displays. Components corresponding to those shown in FIG. 1 are depicted with the same reference numerals. Also, the above descriptions of the various embodiments, e.g., the various configurations of the substrate, the contrast device, the MLA, the beam of radiation, etc., remain applicable.

As shown in FIG. 2, the projection system PS includes a beam expander, which comprises two lenses L1, L2. The first lens L1 is arranged to receive the modulated radiation beam B and focus it through an aperture in an aperture stop AS. A further lens AL can be located in the aperture. The radiation beam B then diverges and is focused by the second lens L2 (e.g., a field lens).

The projection system PS further comprises an array of lenses MLA arranged to receive the expanded modulated radiation B. Different portions of the modulated radiation beam B, corresponding to one or more of the individually controllable elements in the patterning device PD, pass through respective different lenses in the array of lenses MLA. Each lens, (e.g., micro lens, ML), focuses the respective portion of the modulated radiation beam B to a point which lies on the substrate W. In this way an array of radiation spots S is exposed onto the substrate W. It will be appreciated that, although only eight lenses of the illustrated array of lenses 14 are shown, the array of lenses can comprise many thousands of lenses (the same is true of the array of individually controllable elements used as the patterning device PD).

Figure 3:
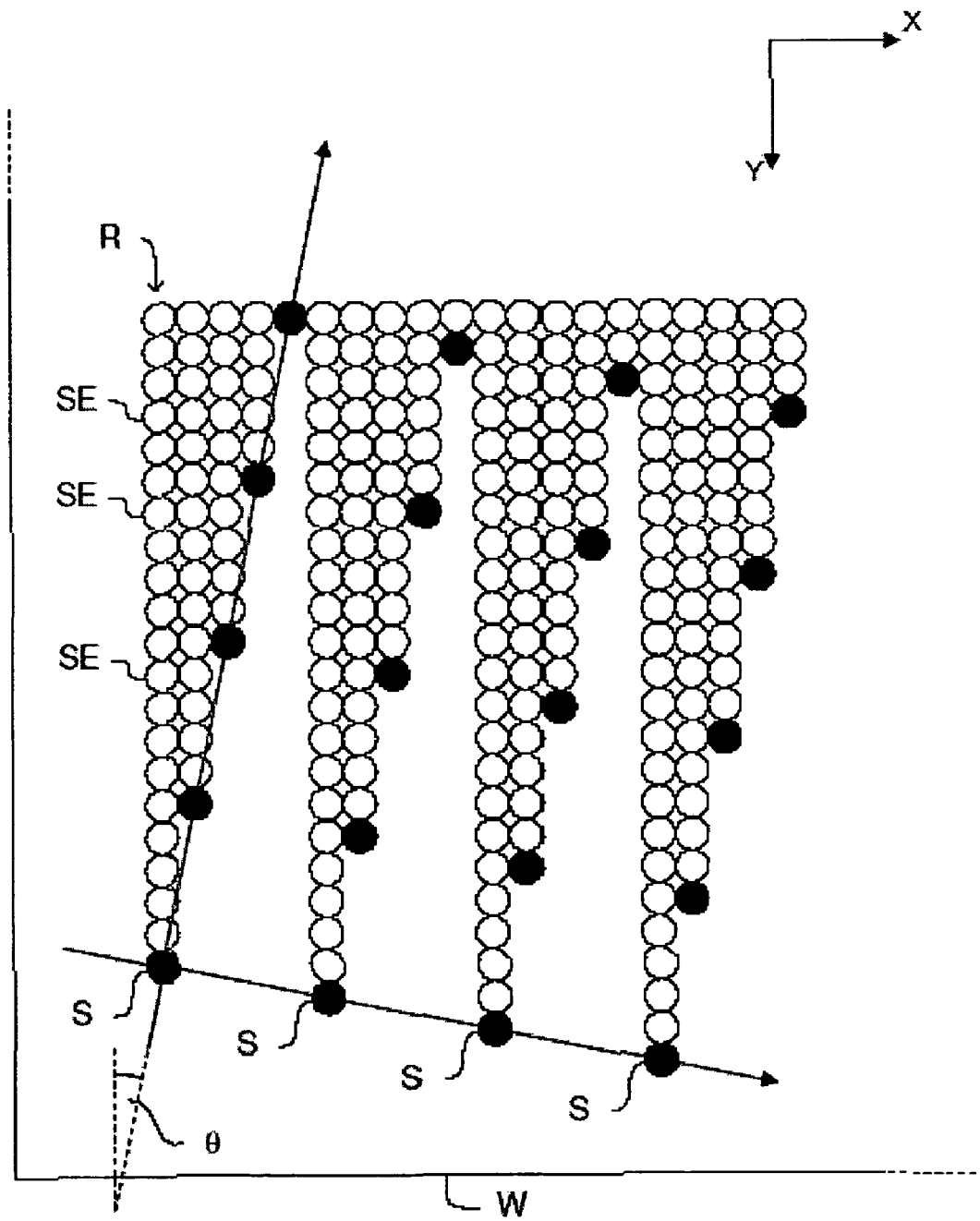
FIG. 3 depicts a mode of transferring a pattern to a substrate according to one embodiment of the invention as shown in FIG. 2.

FIG. 3 illustrates schematically how a pattern on a substrate W is generated using the system of FIG. 2, according to one embodiment of the present invention. The filled in circles represent the array of spots S projected onto the substrate W by the array of lenses MLA in the projection system PS. The substrate W is moved relative to the projection system PS in the Y direction as a series of exposures are exposed on the substrate W. The open circles represent spot exposures SE that have previously been exposed on the substrate W. As shown, each spot projected onto the substrate by the array of lenses within the projection system PS exposes a row R of spot exposures on the substrate W. The complete pattern for the substrate is generated by the sum of all the rows R of spot exposures SE exposed by each of the spots S. Such an arrangement is commonly referred to as "pixel grid imaging," discussed above.

It can be seen that the array of radiation spots S is arranged at an angle $\theta$ relative to the substrate W (the edges of the substrate lie parallel to the X and Y directions). This is done so that when the substrate is moved in the scanning direction (the Y-direction), each radiation spot will pass over a different area of the substrate, thereby allowing the entire substrate to be covered by the array of radiation spots 15. In one example, the angle $\theta$ is at most 20°, 10°, e.g., at most 5°, at most 3°, at most 1°, at most 0.5°, at most 0.25°, at most 0.10°, at most 0.05°, or at most 0.01°. In one example, the angle $\theta$ is at least 0.001°.

Figure 4:
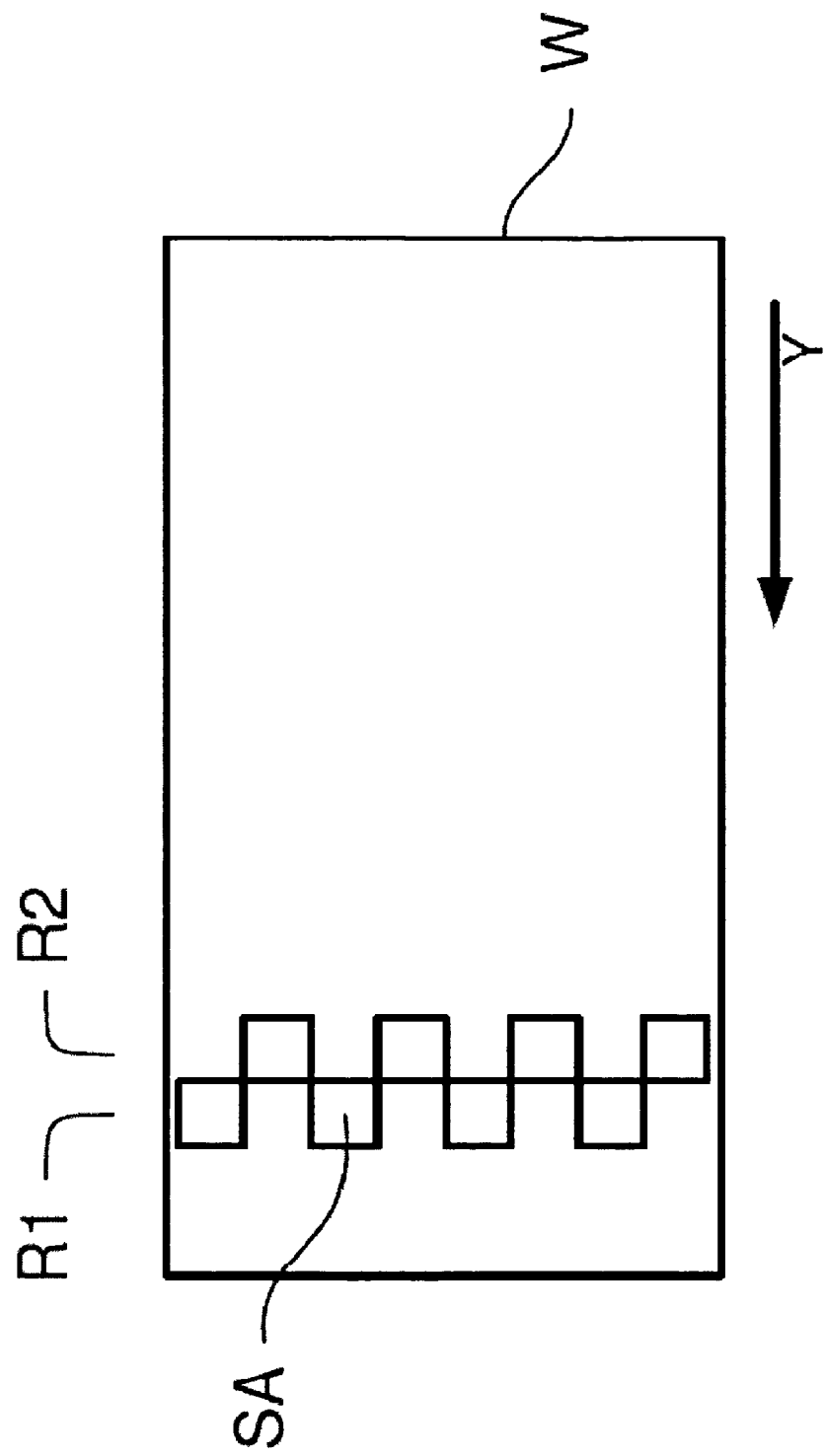
FIG. 4 depicts an arrangement of optical engines, according to one embodiment of the present invention.

FIG. 4 shows schematically how an entire flat panel display substrate W can be exposed in a single scan using a plurality of optical engines, according to one embodiment of the present invention. In the example shown eight arrays SA of radiation spots S are produced by eight optical engines (not shown), arranged in two rows R1, R2 in a "chess board" configuration, such that the edge of one array of radiation spots (e.g., spots S in FIG. 3) slightly overlaps (in the scanning direction Y) with the edge of the adjacent array of radiation spots. In one example, the optical engines are arranged in at least 3 rows, for instance 4 rows or 5 rows. In this way, a band of radiation extends across the width of the substrate W, allowing exposure of the entire substrate to be performed in a single scan. It will be appreciated that any suitable number of optical engines can be used. In one example, the number of optical engines is at least 1, e.g., at least 2, at least 4, at least 8, at least 10, at least 12, at least 14, or at least 17. In one example, the number of optical engines is less than 40, e.g., less than 30 or less than 20.

Each optical engine can comprise a separate illumination system IL, patterning device PD and projection system PS as described above. It is to be appreciated, however, that two or more optical engines can share at least a part of one or more of the illumination system, patterning device and projection system.

Exemplary Radiation Producing Arrangements

FIGS. 5, 6, and 7 show various radiation producing arrangements including a reflective loop system, according to various embodiments of the present invention FIG. 5 shows a radiation system 500, according to one embodiment of the present invention. Radiation system 500 includes a radiation source SO, a reflective loop system RL, and an illuminator IL. Source SO and reflective loop system RL are located separately from illuminator IL. For example, reflective loop system RL can be used in place of, or included in, beam delivery system BD in FIGS. 1 and 2.

Radiation source SO produces a (partially) coherent or coherent radiation beam 502, which is formed into a more incoherent radiation beam 504 using reflective loop system RL. As discussed in more detail below with respect to FIGS. 9-17, reflective loop system RL allows for a loop path or non-overlapping loop paths (e.g., round trips through reflective loop system RL), through which a more coherent beam 504 is produced. In one example, incoherent beam 504 can be produced from summing characteristics of output beams produced after each loop or round trip (hereinafter, both terms will be considered interchangeable and be referred to as loop, unless otherwise noted), for one or more loops. Additionally, each loop is longer than a temporal coherence length of partially coherent beam 502, such that substantially no interference of light occurs within reflective loop system RL. By eliminating interference, speckle patterns are eliminated.

It is to be appreciated that reflective loop system RL can be considered a beam expander, a delay loop, a field defining element, or the like, depending on its positioning and application within a particular optical system, as would be apparent to a skilled artisan upon reading and understanding this description. These non exhaustive exemplary reflective loop systems are described in more detail below.

FIG. 6 shows a radiation system 600, according to one embodiment of the present invention. Radiation system 600 includes a radiation SO, which comprises a radiation device RD and a reflective loop system RL, and an illuminator IL. Additionally, or alternatively, a beam delivery system BD (not shown, but see FIGS. 1 and 2) may also be included in radiation system 600 between radiation source SO and illuminator IL. Radiation system 600 functions similarly to radiation system 500, discussed above. One exception is that radiation source SO produces incoherent radiation 504 using reflective loop system RL. Additionally, or alternatively, some source SO functions are in front and some are behind reflective loop system RL.

FIG. 7 shows a radiation system 700, according to one embodiment of the present invention. Radiation system 700 has an illuminator IL comprising a radiation source SO and a reflective loop system RL. Additionally, or alternatively, light exiting reflective loop system RL may be directed onto optics or onto a patterning device (not shown, see FIGS. 1 and 2). Radiation system 700 functions similarly to radiation system 500, discussed above. Additionally, or alternatively, some illuminator IL functions are in front and some are behind reflective loop system RL.

Alternatively, or additionally, radiation systems 500, 600, and 700 can be used for other illumination systems of a lithography apparatus, i.e., other than an exposure illumination system, such as an alignment illumination system or detection system without departing from the scope of the present invention.

Additionally, or alternatively, radiation systems 500, 600, and 700 can be used in place of any illumination system that requires forming of an incoherent light beam and/or more uniform light, for example to substantially eliminate speckle patterns by not allowing speckle to occur.

FIG. 8 shows a reflective loop system RL including a first reflective loop system RL1 (e.g., an upstream system) and a second reflective loop system RL2 (e.g., a downstream system), according to one embodiment of the present invention. Additionally, or alternatively, optics can be used between first and second reflective loop systems RL1 and RL2. For example, the optics can include cylindrical lenses to optically couple reflective loop systems RL1 and RL2. Through use of two sequential reflective loop systems RL1 and RL2, radiation from a radiation source SO can be mixed in first and second directions. For example, this dual loop arrangement can allow for both X and Y direction mixing.

Additionally, or alternatively, a combined coherence length is desired to be smaller than the temporal coherence length, such that:

$$|n*L1-m*L2|>L\text{coherence}$$

In this equation, n and m are respectively roundtrip numbers within first and second reflective loop systems RL1 and RL2; n is an integer smaller or equal to the total number of roundtrips (N) within loop 1, m is an integer smaller or equal to the total number of roundtrips (M) within loop 2. L1 and L2 are the loop path lengths of respective first and second reflective loop systems RL1 and RL2, and Lcoherence is the temporal coherence length of the radiation source SO radiation, e.g., at least partially coherent radiation 502. Additionally, or alternatively, if additional reflective loop systems are utilized, the relationship can be represented by:

$$|n*L1-m*L2\pm o*L3\pm p*L4\pm \ldots |>L\text{coherence}$$

Additionally, or alternatively, one or more additional reflective loop systems RLm (m=1, 2, 3, ...) can be used that are optically coupled in series, according to another embodiment of the present invention. Each reflective loop system RLm can receive incoherent radiation from an upstream reflective loop system RL and can allow for the incoherent radiation to loop through one or more loops or roundtrips to produce another beam of incoherent radiation. For example, if there are (Mx) loop path systems in series, every loop path creates N incoherent copies of the at least partially coherent beam 502. The total number of modes realized using a series of reflective loop systems RL equals N^M, instead of N*M when the copies are produced within a single reflective loop system RL. In some applications, having series coupled reflective loop systems RL may be desirable, for example because an amount of reflection scales with N*M and the transmission scales with ~Re^(N*M) (where Re is reflectance percentage of reflective devices within each reflective loop system). Thus, when using multiple reflective loop systems in series they result in a higher overall transmission of radiation intensity than one large reflective loop system.

For example, if N=2, with 4 reflections per single loop, the transmission equals: x+(1−x)*R^4, where R equals the reflection coefficient of one mirror (e.g., R~0.98%), x equals the fraction of the beam passing the first time (e.g., x is a little bit less than 50%), it may be desirable for the following to be true:

$$x=R^4/(1+R^4)=0.4798.$$

In this case, the 0-pass and 1st-pass have substantially identical intensity, and transmission is about 96%. Thus, putting four of the reflective loop systems in series results in 84.8% transmission (0.96^4) and 2^4=16 incoherent copies of the at least partially coherent beam 502.

However, the alternative would be to use one loop path system, where 15+1 roundtrips are made. This has a transmission of:

$$0.92^0/16+0.92^1/16+0.92^2/16+0.92^3/16+0.92^4/\\16+0.92^5/16+0.92^6/16+0.92^7/16+0.92^7/16+\\0.92^9/16+0.92^10/16+0.92^11/16+0.92^12/16+\\0.92^13/16+0.92^14/16+0.92^15/16+0.92^16/\\16=58.4\%.$$

Thus, if a higher overall transmission of beam intensity is desired, it may be more desirable to use series coupled reflective loops systems producing, for example, one loop per system than one large reflective loop system producing all the loops.

Exemplary Reflective Loop System Configurations

FIGS. 9, 10, 11, 12, 13, 14, 15, 16, and 17 show various reflective loop systems RL, according to various embodiments of the present invention.

First Exemplary Reflective Loop System Configuration

Figure 9:
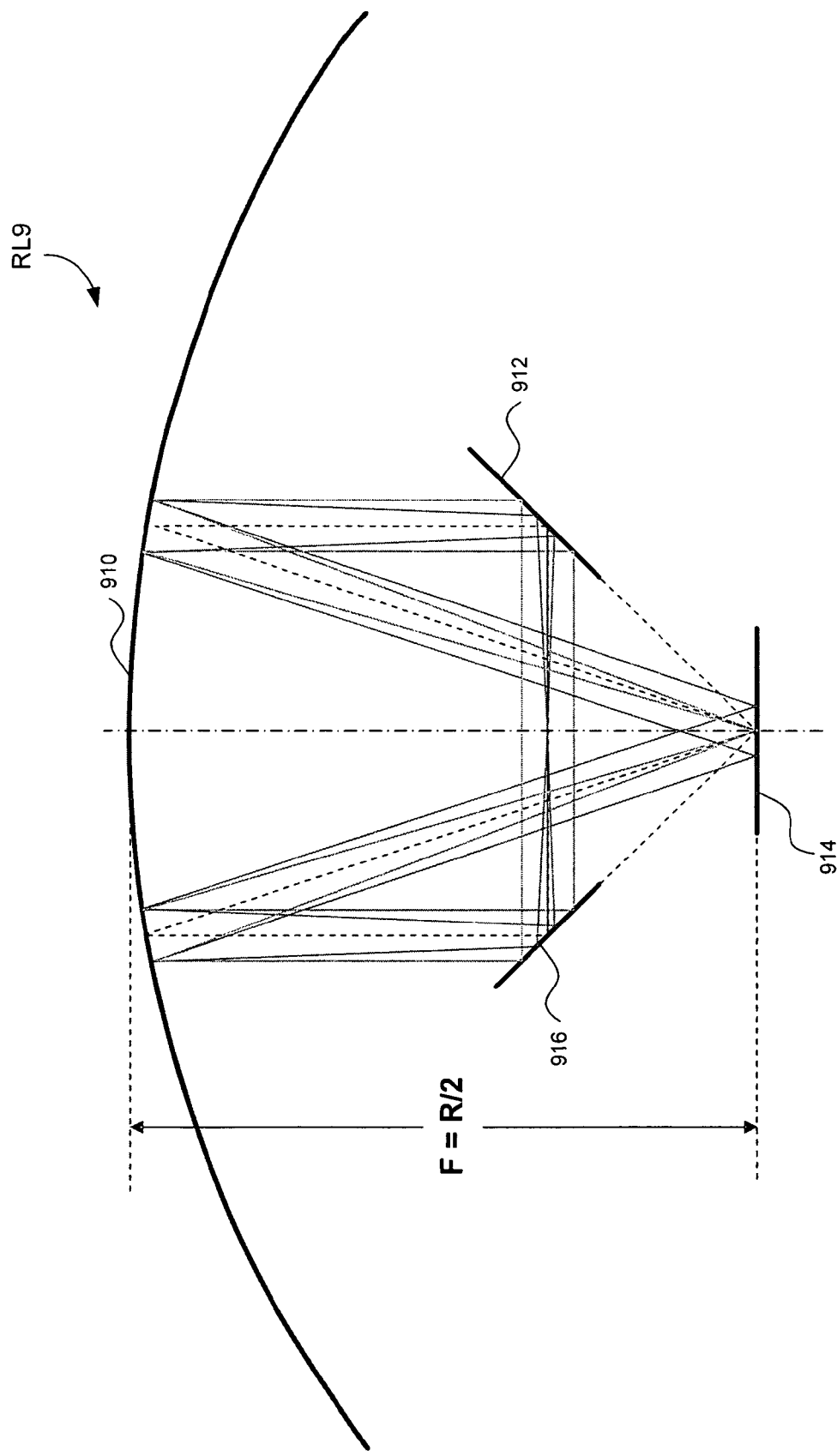
Figure 10:
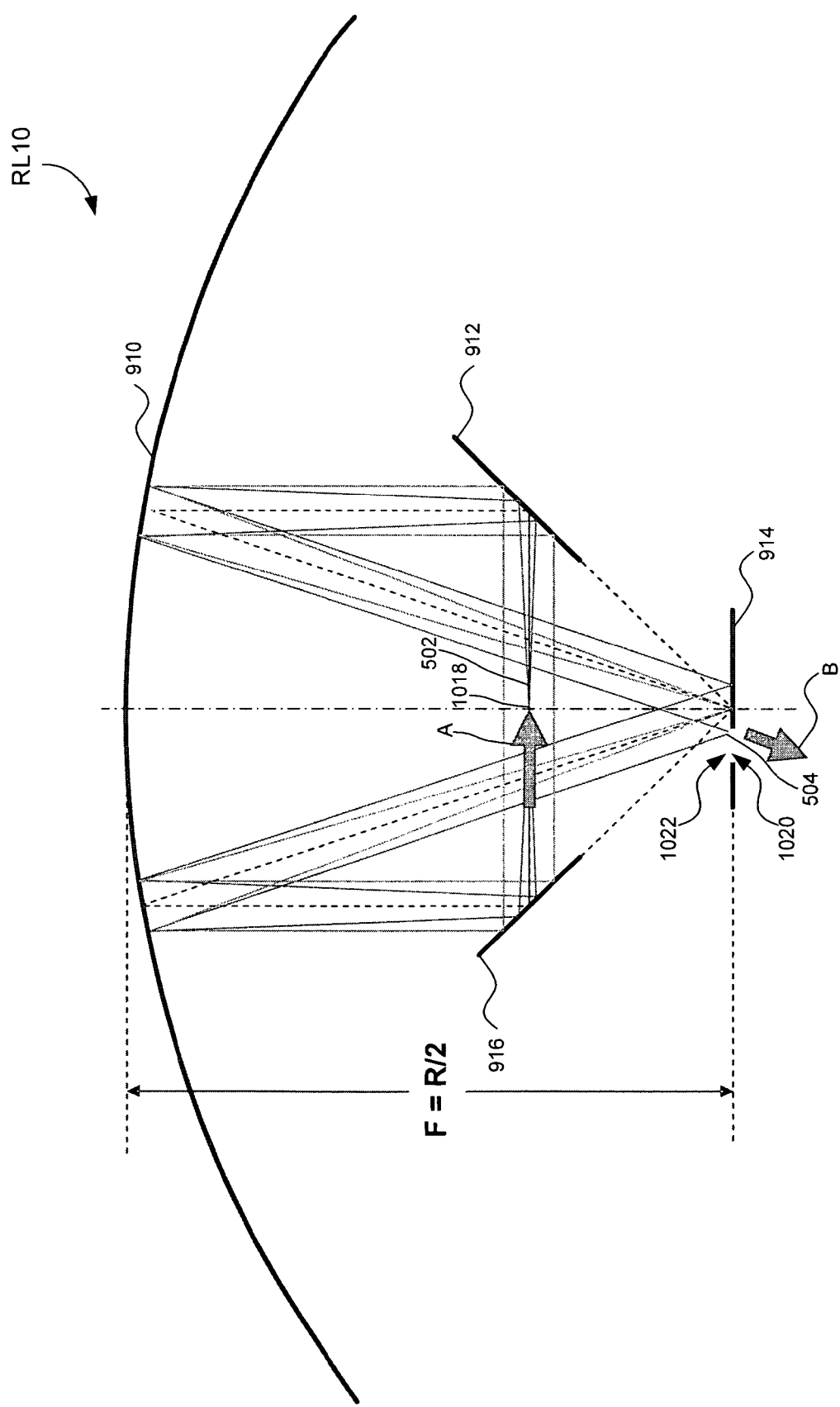
Figure 11:
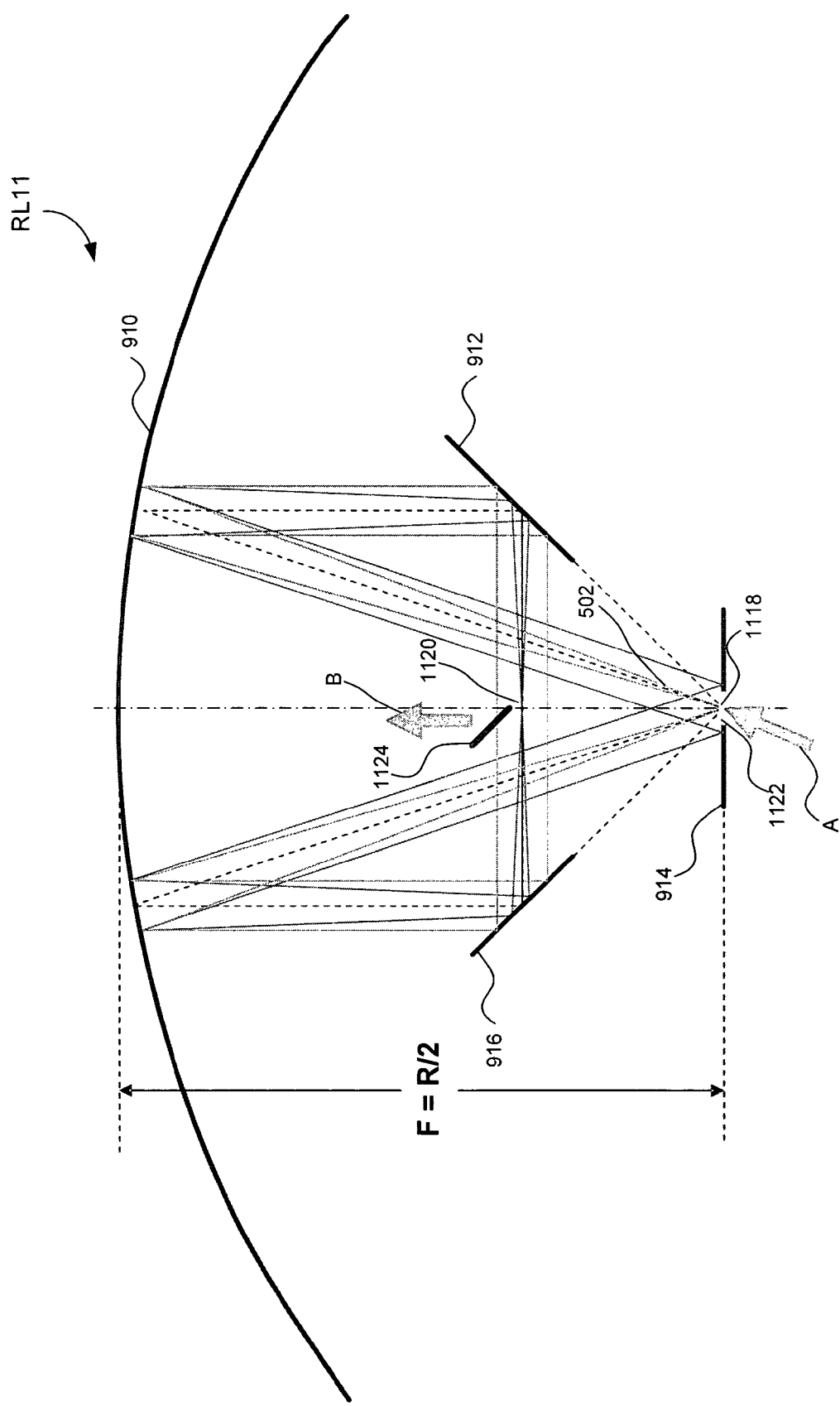
Figure 12:
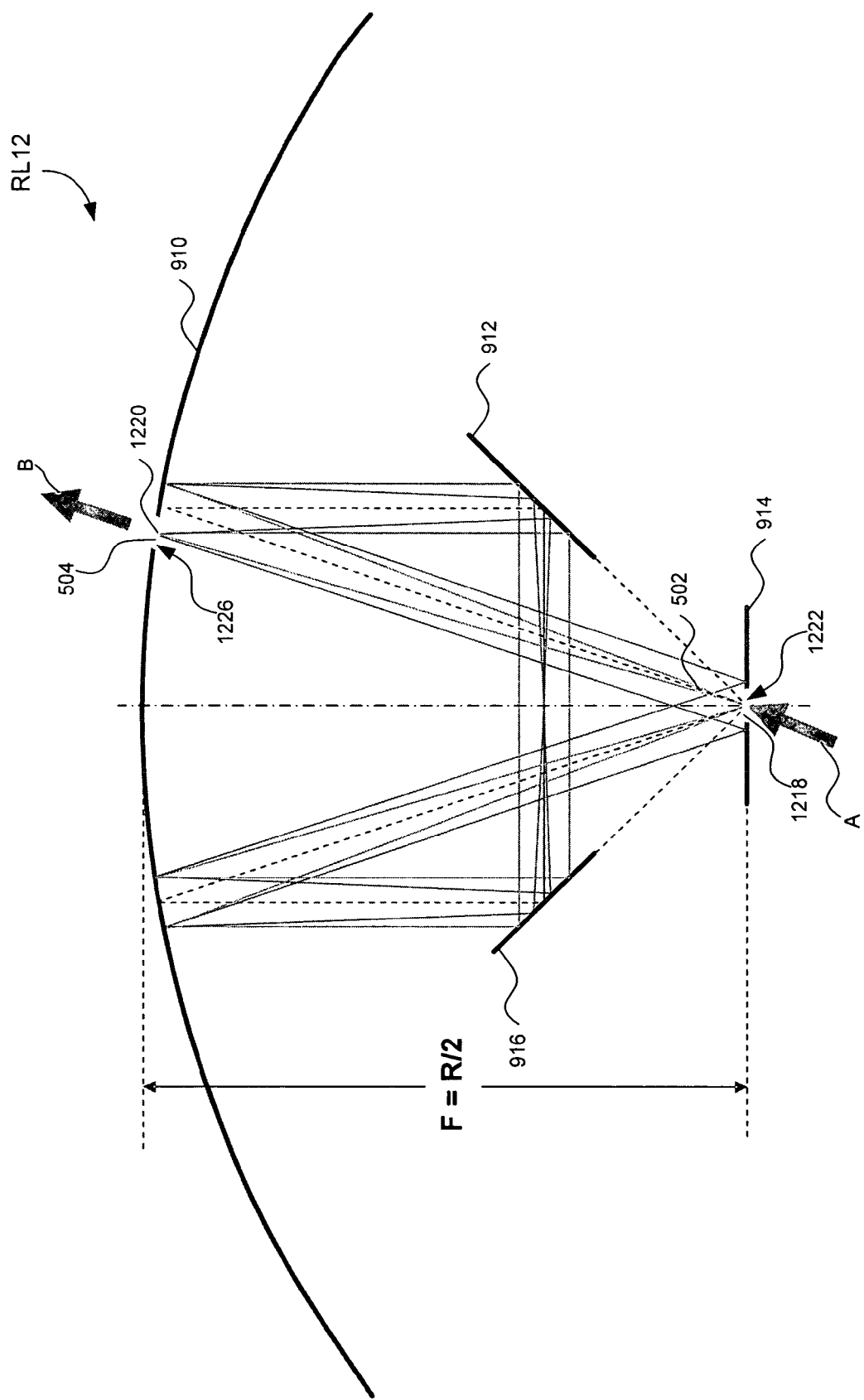
Figure 13:
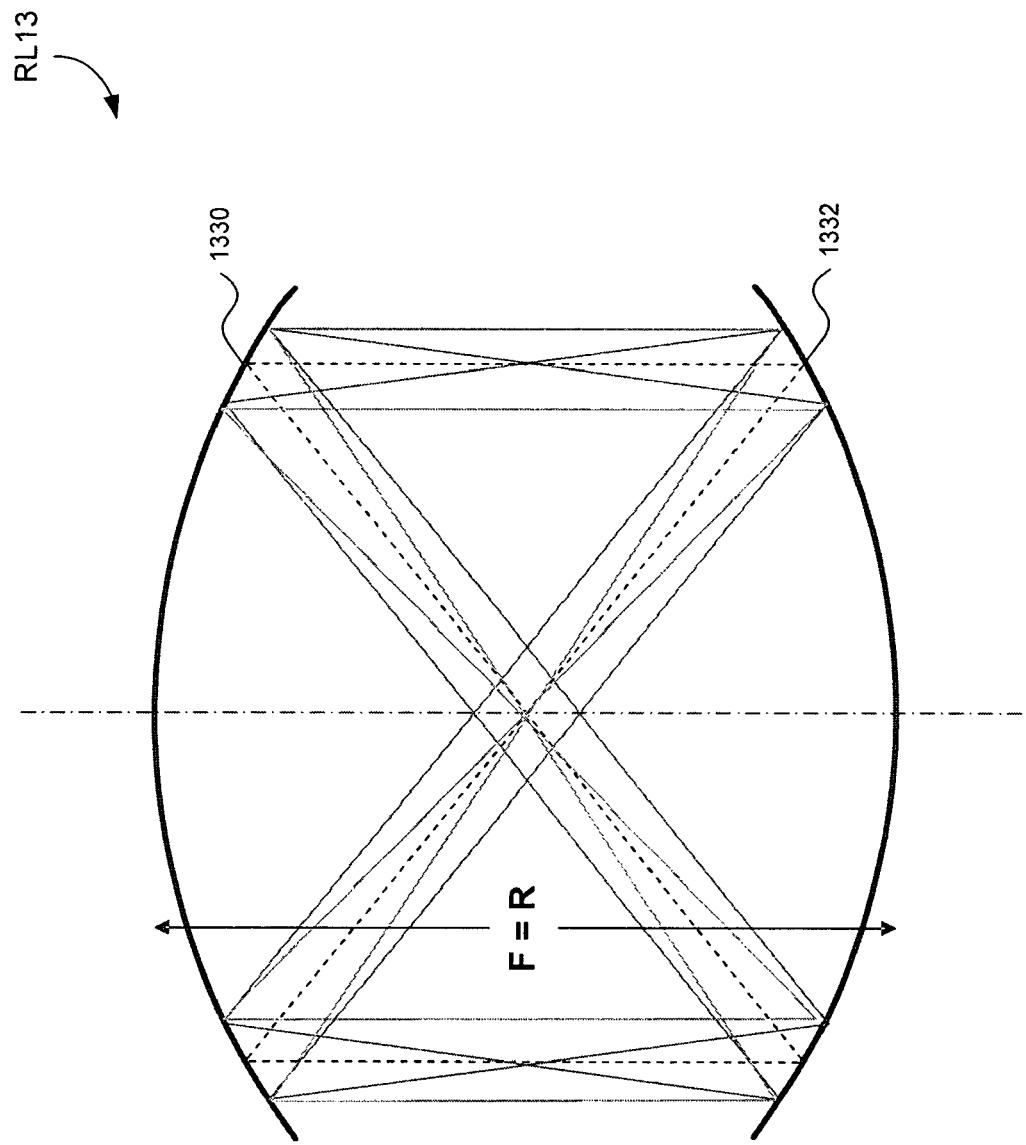

FIG. 9 shows a first configuration of a reflective loop system RL9, while FIGS. 10, 11, and 12 show similar respective reflective loops systems RL10, RL11, and RL12 having various entrance and exit positions, according to various embodiments of the present invention.

With reference to FIG. 9, reflective loop system RL9 comprises a first reflector 910, a second reflector 912, a third reflector 914, and a fourth reflector 916. For example, each reflector can be, but are not limited to, mirrors or other similar reflective devices. First reflector 910 is a curved reflector having a radius R. In one example, reflective loop system RL9 is arranged such that a focal length of reflective loop system RL9 is one-half of the radius R of first reflector 910. Second, third, and fourth reflectors 912, 914, and 916, respectively, are planar reflectors. Second and fourth reflectors 912 and 916, respectively, can be angled between 0 and 90 degrees, for example 45 degrees, and are associated with a pupil of reflective loop system RL9, while third reflector 914 is associated with a field of reflective loop system RL9. Typically, a field is where the looping beam is most concentrated, while a pupil is where the looping beam is least concentrated. Any place within the reflective loop system RL can be chosen to be a field or a pupil plane. The relation between field and pupil are that angles at one location correspond to positions at the other (and visa versa). It is desirable to select either or both of field and pupil at a mirror surface in order to make the beam enter and exit, but the invention is not limited to these locations. In one example, through moving or tilting of one or both of second and fourth reflectors 912 and 916, subsequent bounces at the third mirror are at different locations. Similarly, through moving or tilting of third reflector 914 subsequent bounces at the second and fourth reflector are at different locations.

Additionally, or alternatively, the first mirror is divided into two mirror segments. In this example, since then every mirror gets bounced only once per roundtrip.

Additionally, or alternatively, respective first through fourth reflectors 910-916 can be arranged to allow for a loop path through reflective loop system RL9 to be larger than a temporal coherence length of the at least partially coherent radiation beam 502 (which beam is not specifically shown, but see FIGS. 5, 6, 7, and 8).

Additionally, or alternatively, a reflective surface of at least one of respective first through fourth reflectors 910-916 can be tilted with respect to reflective surfaces of the other ones of respective first through fourth reflectors 910-916 to allow for "non-overlapping" sequential loops. This tilting can also allow for a "walking" of the beam path near an exit of reflective loop system RL9 (the exit is not specifically shown, but see FIGS. 10, 11, and 12) after each loop, described in more detail below. This "walking" can allow for a portion of the beam to exit reflective loop system RL9 after each loop, and a portion of the beam to reflect through the loop again. Increasing a number of loops made by the beam can increase incoherency in incoherent beam 504 (which beam is not specifically shown, but see FIGS. 5, 6, 7, and 8).

FIG. 10 shows an entrance position 1018 at arrow A and an exit position 1020 at arrow B of a reflective loop system RL10, according to one embodiment of the present invention. In this example, an opening or pin hole 1022 is formed in third reflector 914, which opening 1022 serves as exit 1020. In various example, a pin hole is meant to be a hole of any shape. For example, the shape may be, but is not limited to: circular, square, elliptical, rectangular or any other free form opening. Since the reflective loop path systems operates along one main direction (within the plane drawn within all figures), a rectangular opening is the most logical choice. Again, at least one reflecting surface of respective first through fourth reflectors 910, 912, 914, and/or 916 is tilted or misaligned with respect to the other reflecting surfaces, such that after each round trip or loop a different portion of the looping beam is transmitted through pin hole 1022, as described below.

In operation, at least partially coherent beam 502 enters reflective loop system at entrance point 1018 and reflects, in sequence, from: second reflector 912, first reflector 910, third reflector 914, first reflector 910, fourth reflector 916, second reflector 912, and first reflector 910. After this last reflection, a portion of the looping beam reflects from third reflector 914 and follows the above sequence, and a portion of the looping beam exits from reflective loop system RL10 through exit 1022 at pin hole 1020 in third reflector 914 to form incoherent beam 504. Thus, if more than one loop is performed, after each loop, a portion of the looping beam will be transmitted through exit 1020 to form incoherent beam 504.

FIG. 11 shows an entrance position 1118 at arrow A and an exit position 1120 at arrow B of a reflective loop system RL11, according to one embodiment of the present invention. In this example, an opening or pin hole 1122 is formed in third reflector 914, which opening 1122 serves as entrance position 1120. Also, in this example the beam is out-coupled through exit position 1120 using a reflecting device 1124, for example a fold mirror. Otherwise, the same basic principles as discussed above regarding the operation of reflective loop system RL10 apply.

In operation, at least partially coherent beam 502 enters reflective loop system RL11 through pin hole 1122 in third reflector 914 and is reflected, in sequence, from: first reflector 910, second reflector 912, fourth reflector 916, first reflector 910, third reflector 914, first reflector 910, and second reflector 912. After this last reflection from second reflector 912, a portion of the looping beam is reflected (out coupled) from reflector 1124 through exit 1120 to form incoherent beam 504 (which beam is not shown), and a portion of the looping beam continues along a light path to reflect from fourth reflector 916, and follows the above sequence again. Thus, if more than one loop is performed, after each loop, a portion of the looping beam will be transmitted through exit 1120 to form incoherent beam 504 (which beam is not shown).

FIG. 12 shows an entrance position 1218 at arrow A and an exit position 1220 at arrow B of a reflective loop system RL12, which is similar to reflective loop system of RL9 of FIG. 9, according to one embodiment of the present invention. In this example, an opening or pin hole 1222 is formed in third reflector 914, which opening 1222 serves as entrance position 1218. Also, in this example an opening or pin hole 1226 is formed in first reflector 910, which serves as exit position 1220. Otherwise, the same basic principles as discussed above regarding the operation of reflective loop system(s) RL10 and RL11 apply.

In operation, at least partially coherent beam 502 enters reflective loop system RL12 through pin hole 1222 in third reflector 914 and is reflected, in sequence, from: first reflector 910, second reflector 912, fourth reflector 916, first reflector 910, and third reflector 914. After this reflection from third reflector 914, a portion of the looping beam is transmitted through pin hole 1226 in first reflector 910, which acts as exit 1120, to form incoherent beam 504 (which beam not shown), and a portion of the looping beam continues along a light path to reflect from first reflector 910 and follows the above sequence again. Thus, if more than one loop is performed, after each loop, a portion of the looping beam will be transmitted through exit 1220 to form incoherent beam 504 (which beam is not shown).

The positions of entrances and exits in reflective loop systems RL10, RL11, and RL12 in respective FIGS. 10, 11, and 12 are meant to be exemplary, and not exhaustive, of entrances and exits from the first configuration of reflective loop system RL9 shown in FIG. 9. Also, it is to be appreciated that optical elements can be used adjacent an entrance and/or exit of any of the exemplary reflective loop systems RL to allow for in-coupling and out-coupling of radiation.

Second Exemplary Reflective Loop System Configuration

FIGS. 13, 14, 15, 16, and 17 show a second configuration of respective reflective loop system RL13 to RL 17 having various entrance and exit positions, according to various embodiments of the present invention. This second configuration, as shown in reflective loop system RL13, is comprised of first and second reflectors 1330 and 1332 (e.g., curved reflectors), respectively. As discussed below, in one example each of first and second reflectors 1330 ad 1332 can be comprised of two mirror segments. This second configuration results in reflective loop system RL having two fields and two pupils per round trip. In one example, the pupil and field are located in an area that is between respective first and second reflectors 1330 and 1332. Alternatively, the pupils and the fields are located at respective surfaces first and second reflectors 1330 and 1332. In either example, because two pupils and fields are present, entrance and exit positions can be chosen from these two positions. Each of respective first and second reflectors 1330 and 1332 has a radius of curvature R. A focal length F of reflective loop system RL13 can be equal to the radius of curvature R.

Alternatively, or additionally, one or both of respective first and second reflectors 1330 and/or 1332 can have first and second halves or portions that are moveable with respect to each other. Based on this movement, the pupils and fields are located in positions at respective first and second reflectors 1330 and 1332, and not between reflectors 1330 and 1332.

Additionally, or alternatively, respective first and second reflectors 1330 and 1332 can be arranged to allow for a loop path through reflective loop system RL13 to be larger than a temporal coherence length of the at least partially coherent radiation beam 502 (which beam is not specifically shown, but see FIGS. 5, 6, 7, and 8).

Additionally, or alternatively, a reflective surface of at least one of reflectors 1330 or 1332, or a part thereof, can be tilted with respect to reflective surfaces of the other one of reflectors 1330 or 1332, or at least a part thereof, to allow for "non-overlapping" sequential loops. For example, the tilting allows for each loop to have a different path in embodiments when more than one loop is performed. Having different paths allows for subsequent beam paths to be non-identical or non-overlapping, which can be used to reduce the possibility of interference between looping beams. For example, this can eliminate speckle. The tilting can also allow for a "walking" of the beam path near an exit of reflective loop system RL13 (the exit is not specifically shown, but see FIGS. 14, 15, 16, and 17) after each loop. This "walking" can allow for a portion of the beam to exit reflective loop system RL13 after each loop, and a portion of the beam to reflect through the loop again. Increasing a number of loops made by the looping beam can increase incoherency in incoherent beam 504 (which beam is not specifically shown, but see FIGS. 5, 6, 7, and 8).

Figure 14:
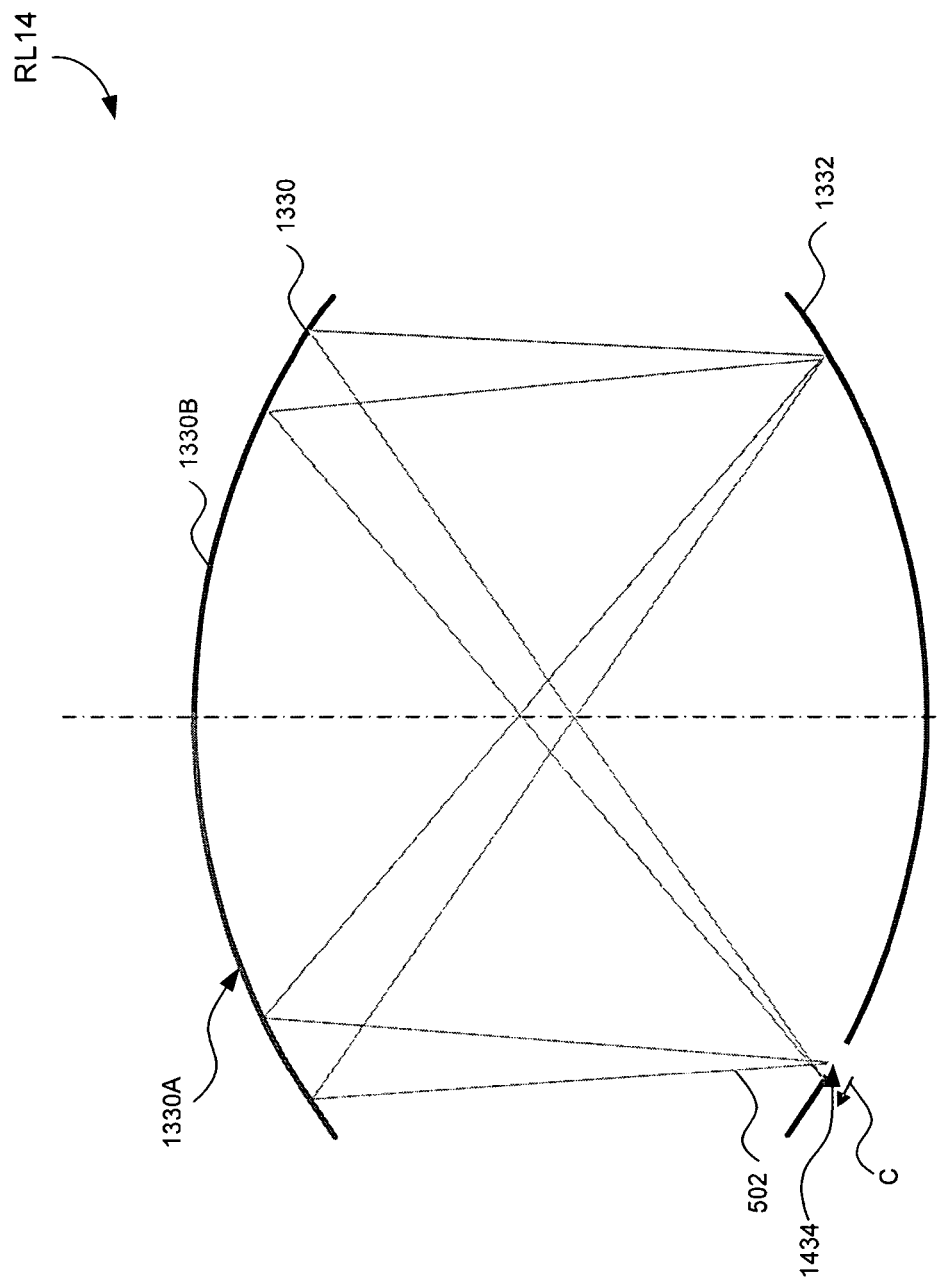
Figure 15:
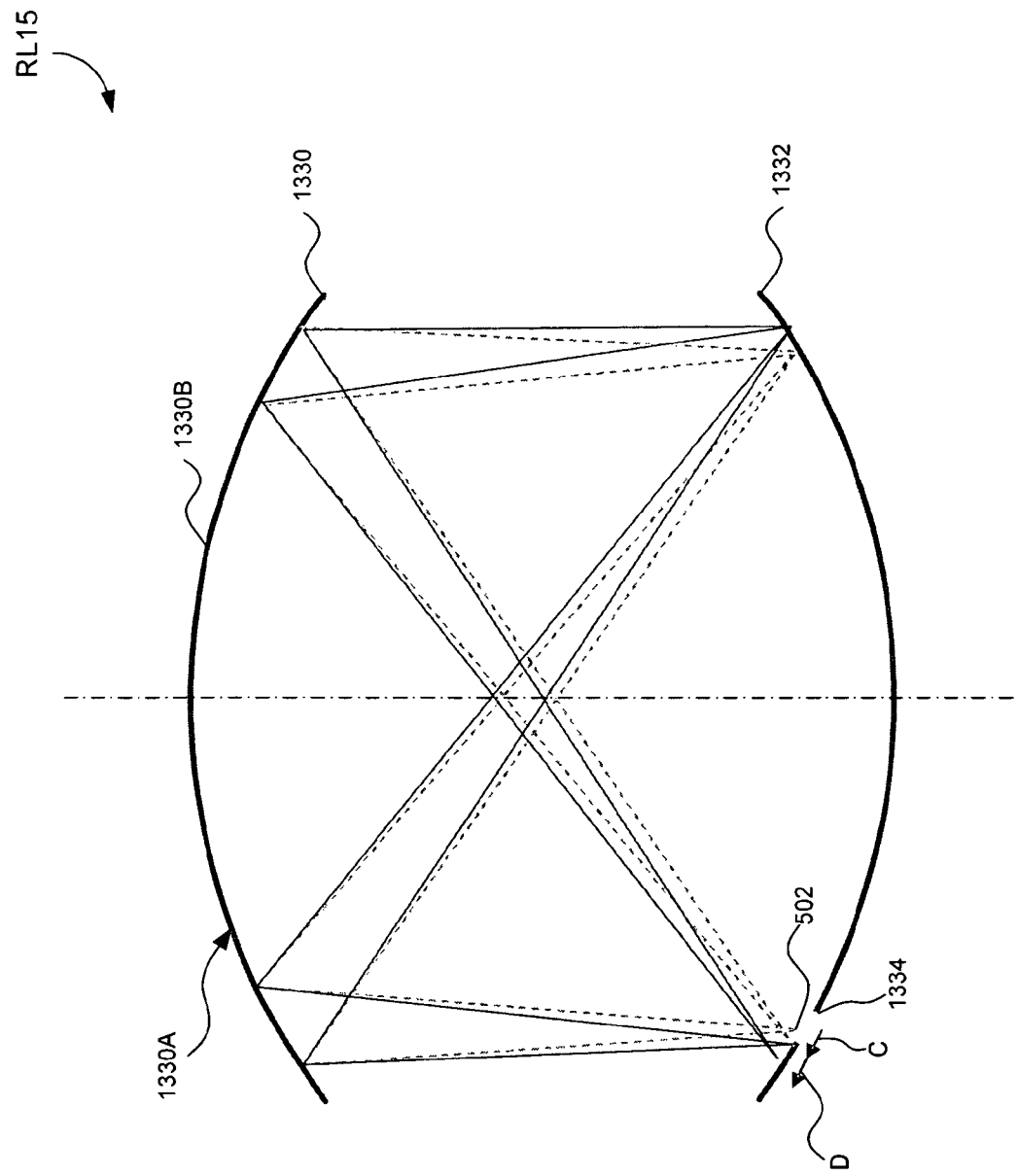

FIGS. 14 and 15 show first and second loop paths, respectively, within reflective loop systems RL14 and RL15, according to one embodiment of the present invention. At least partially coherent beam 502 enters reflective loop system RL14 through a pin hole or opening 1434 (FIG. 14), or opening 1334 (FIG. 15), in second reflector 1332, which opening 1434 also functions as both an entrance and exit of reflective loop system RL14. In this example, first reflector 1330 includes first half or portion 1330A and second half or portion 1330B. First portion 1330A is moveable with respect to second portion 1330B so that its reflecting surface is misaligned or tilted with respect to a reflecting surface of second reflector 1332, which allows for the "walking" as discussed above.

In one example, as seen in FIG. 14, after passing through the entrance 1434, at least partially coherent beam 502 is reflected, in sequence, from: first half 1330A of first reflector 1330, second reflector 1332, second half 1330B of first reflector 1330, and back to second reflector 1332. Arrow C shows "beam walk" happening after the first loop based on the partial misalignment or tilting of first reflector 1330 with respect to second reflector 1332. Then, as seen in FIG. 15 (first loop from FIG. 14 is dashed lines in FIG. 15, and second loop is solid lines in FIG. 15), a second loop is formed, in sequence, from a reflection from: second reflector 1332, first half 1330A of first reflector 1330, second reflector 1332, and second half 1330B of first reflector 1330. Arrow D shows a "beam walk" after the second loop. As can be seen, in the perspective of FIG. 15, beam walk is occurring from right to left.

If additional loops are performed, after each subsequent loop, a portion of the looping beam will be transmitted through exit 1434 to form incoherent beam 504 (which beam is not shown). For example, after looping through reflective loop system RL14, a portion of the looping beam is transmitted through exit 1434, and a remaining portion of the looping beam is reflected from second reflector 1332 to follow the loop path again.

Figure 16:
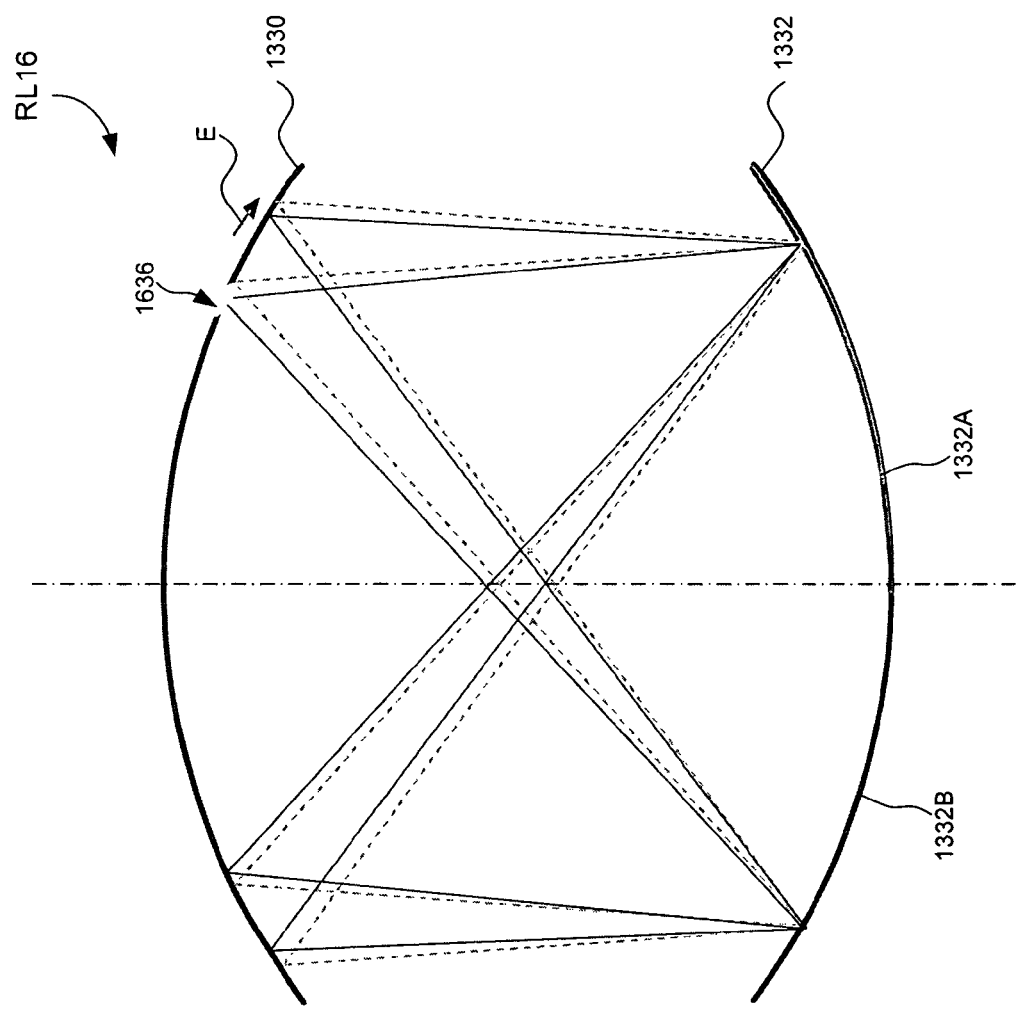
Figure 17:
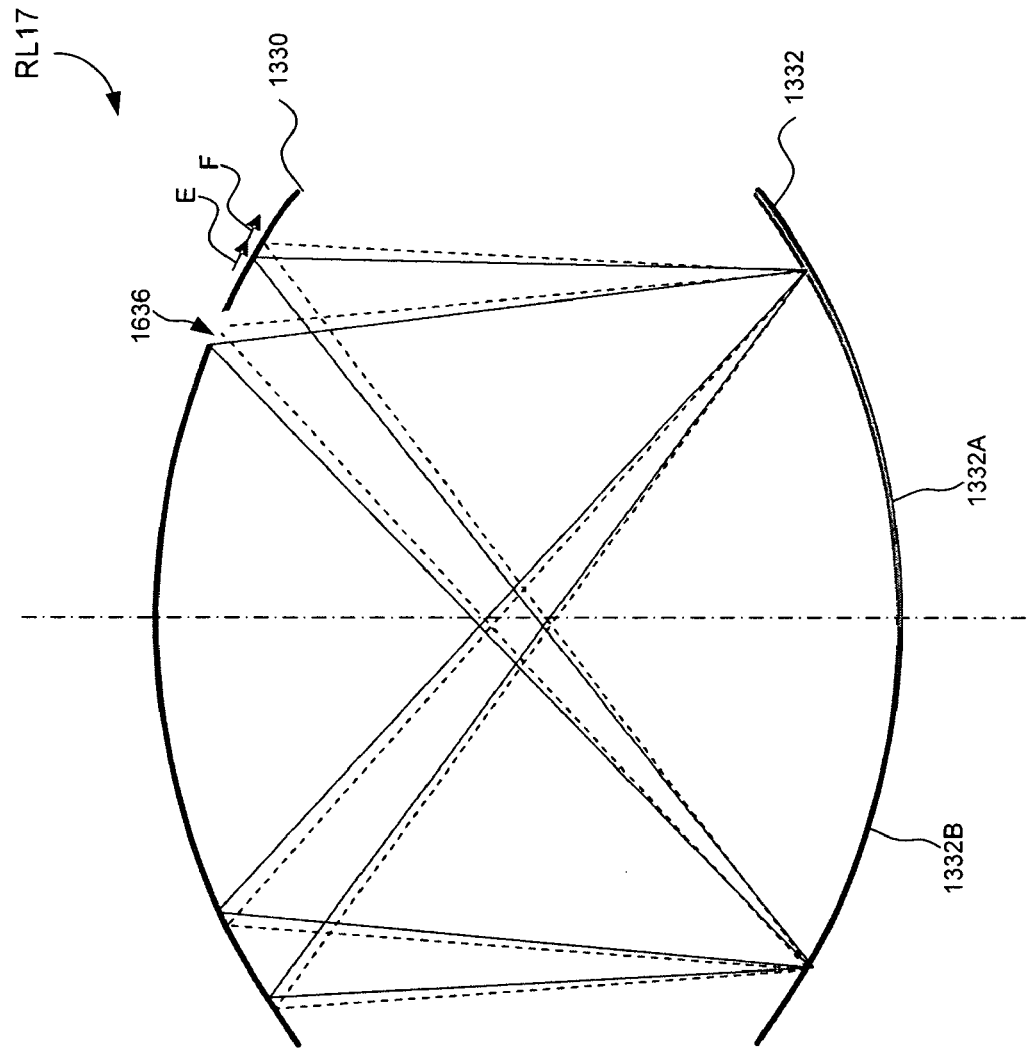

FIGS. 16 and 17 show first and second loop paths, respectively, within the second configuration of reflective loop systems RL16 and RL17, according to one embodiment of the present invention. In this configuration, an opening or pin hole 1636 in first reflector 1330 is used as an entrance and exit point. At least partially coherent beam 502 enters reflective loop system RL16 through pin hole 1636 in first reflector 1330. In this example, second reflector 1332 comprises first half or portion 1332A and second half or portion 1332B. First portion 1332A is moveable with respect to second portion 1332B. A reflective surface of first portion 1332A can be misaligned or tilted with respect to a reflective surface of first reflector 1330, which allows for the "walking," as discussed above.

In one example, as seen in FIG. 16, after passing through the entrance 1636, at least partially coherent beam 502 is reflected, in sequence, from: first half 1332A of second reflector 1332, first reflector 1332, second half 1332B of second reflector 1332, and back to first reflector 1330. Arrow E shows "beam walk" occurring after the first loop based on the partial misalignment or tilting of a reflective surface of first reflector with 1330 with respect to a reflective surface of second reflector 1332. Then, as seen in FIG. 17, a second loop is formed from a reflection, in sequence, from: first reflector 1330, from first half 1332A of second reflector 1332, first reflector 1330, and second half 1332B of second reflector 1332. Arrow F shows a "beam walk" after the second loop. As can be seen, in the perspective of FIG. 17, beam walk is occurring from left to right.

If additional loops are performed, after each subsequent loop, a portion of the looping beam will be transmitted through exit 1636 to form incoherent beam 504 (which beam is not shown). For example, after looping, a portion of the looping beam is transmitted through exit 1636, and a remaining portion of the looping beam is reflected from first reflector 1330 to follow the loop path again.

Exemplary Arrangement of Reflective Loop System

In one example, reflective loop system RL can be arranged based on the following relationships:

$$t_p = \sin\left(\frac{f_o}{F}\right)$$

$$t_f = \sin\left(\frac{x_o}{F}\right)$$

-continued $$D = 2 \cdot \sin\left(\frac{d_i}{2}\right) \cdot F$$
$$D = N \cdot x_0$$
$$\Rightarrow F = \frac{N \cdot x_0}{2 \cdot \sin\left(\frac{d_i}{2}\right)}$$

$$X = N \cdot f_o$$
$$d_o = \sin\left(\frac{X \cdot F}{2}\right)$$
$$f_o = \frac{2 \cdot F \cdot \arcsin(d_o)}{N}$$

where:
$x_i$=beam size at entrance [mm]
$d_i$=beam divergence at entrance [mrad]
$x_o$=beam size at exit [mm]
$d_o$=beam divergence at exit [mrad]
N=number off roundtrips
F=focal length of lens used [m]
D=beam size at pupil plane [m]
$f_o$=field opening. [m]
X=beam size at field plane [m]
$t_f$=tilt of beam in field plane [rad]
$t_p$=tilt of beam in pupil plane [rad]

The following Table 1 shows exemplary parameters can be used for an exemplary reflective loop system RL:

TABLE 1

| Inpurt | | | | |
|---|---|---|---|---|
| $d_i$ | Divergence in | [mrad] | | 100 |
| $X_i$ | Size in | [mm] | | 1 |
| $d_o$ | Divergence in | [mrad] | | 50 |
| $X_o$ | Field size out | [mm] | | 10 |
| N | N roundtrips | | | 10 |
| Output | | | | |
| F | Focal length | [m[ | | 1.00 |
| $F_o$ | Field opening | [mm] | | 5.00 |
| $t_f$ | Tilt field | [mrad] | | 10.00 |
| $t_p$ | Tilt pupil | [mrad] | | 5.00 |
| Other | | | | |
| | Loop length | [m] | | 4 |
| | Total length | [m] | | 40 |
| | Total time | [ns] | | 133 |
| X | Field mirror size | [mm] | | 50 |
| D | Beam @ pupil | [mm] | | 100 |

Exemplary Graphical Representation of Output Illumination from Reflective Loop System FIG. 18 graphically depicts entrance and exit illumination intensity distribution from a reflective loop system RL (not shown), according to one embodiment of the present invention. For example, any of the above discussed reflective loop systems can be used as reflective loop system RL of this embodiment. In one example, an entrance of reflective loop system RL will receive an intensity distribution 1800. An exit of reflective loop system RL for each loop or round trip is arranged to select different parts 1802 of distribution of light 1804 exiting reflective loop system RL. An output at the exit is basically a sum of all exit intensity distributions 1806, such that the output exhibits a uniform intensity profile 1808. In one example, graphic 1806 represents a field and graphic 1808 represents a pupil. In operation, graphic 1806 represents the light intensity distribution at the exit after a first round trip. After each round trip, an image shifts one segment to the left, so the next part 1802 of light distribution 1804 exits reflective loop system RL. An integral of the sum 1808 combining each round trip's intensity profile 1806 is determined after each or all round trips, which is desirably uniform.

Additionally, or alternatively, reflective loop system RL can function as a beam expander. By making the entrance window larger than the beam size, the etendue of the beam increases. The etedue of the beam is defined as the product of the field distribution and angular distribution of light. The etendue increase equals entrance window size divided by the entrance beam size.

Additionally, or alternatively, a reflective loop system RL can function as a field defining element in an exposure illumination system. When used as a field defining element, reflective loop system RL points within the pupil can be truly incoherent, such that no speckle is caused. Thus, no speckle reduction is required because no speckle is generated. For example, when used as a field defining, an exit beam can be an incoherent sum of all light exiting per round trip (see FIG. 18).

Additionally, or alternatively, a reflective loop system RL can be used as a pulse stretcher. For example, as an exit pulse length stretched, such that an exit pulse length will be equal to the entrance pulse length+the total delay of the system (number of round trips*length of one round trip).

Exemplary Operation

FIG. 19 is a flowchart depicting a method 1900, according to one embodiment of the present invention. For example, method 1900 can be performed using any one of systems 500, 600, 700, or 800 using any one of the exemplary reflective loops systems RL and RL9 to RL 17, as described above.

In step 1902, a coherent or partially coherent beam is reflected through a loop to form an incoherent beam. In step 1904, an illumination beam is formed from the incoherent beam. In step 1906, the illumination beam is patterned. In step 1908, the patterned illumination beam is projected onto a target portion of a substrate.

Although specific reference can be made in this text to the use of lithographic apparatus in the manufacture of a specific device (e.g., an integrated circuit or a flat panel display), it should be understood that the lithographic apparatus described herein can have other applications. Applications include, but are not limited to, the manufacture of integrated circuits, integrated optical systems, guidance and detection patterns for magnetic domain memories, flat-panel displays, liquid-crystal displays (LCDs), thin-film magnetic heads, micro-electromechanical devices (MEMS), light emitting diodes (LEDs), etc. Also, for instance in a flat panel display, the present apparatus can be used to assist in the creation of a variety of layers, e.g. a thin film transistor layer and/or a color filter layer.

Although specific reference can have been made above to the use of embodiments of the invention in the context of optical lithography, it will be appreciated that the invention can be used in other applications, for example imprint lithography, where the context allows, and is not limited to optical lithography. In imprint lithography a topography in a patterning device defines the pattern created on a substrate. The topography of the patterning device can be pressed into a layer of resist supplied to the substrate whereupon the resist is cured by applying electromagnetic radiation, heat, pressure or a combination thereof. The patterning device is moved out of the resist leaving a pattern in it after the resist is cured.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

It is to be appreciated that the Detailed Description section, and not the Summary and Abstract sections, is intended to be used to interpret the claims. The Summary and Abstract sections can set forth one or more, but not all exemplary embodiments of the present invention as contemplated by the inventor(s), and thus, are not intended to limit the present invention and the appended claims in any way.

What is claimed is:

1. A system, comprising:
a source of radiation that produces a coherent or partially coherent beam; and
a reflective loop system comprising a reflective device comprising at least one opening,
wherein the reflective device is configured to reflect the coherent or partially coherent beam through one or more loops, each of the loops comprising four reflections, to form a more incoherent beam,
wherein the beam enters or exits the reflective loop system through the at least one opening, and
wherein the reflective loop system includes a field plane and a pupil plane.

2. The system of claim 1, wherein the reflective loop system comprises a first and second reflective device.

3. The system of claim 2, wherein the first and second reflective devices are both curved.

4. The system of claim 2, wherein at least one of the first and second reflective devices comprises first and second portions and at least one of the first and second portions is misaligned with respect to respective reflective surfaces of the first and second reflective devices.

5. The system of claim 1, wherein the reflective loop system comprises second through fourth reflective devices.

6. The system of claim 5, wherein the four reflective devices comprise three planar reflective devices and a curved reflective device.

7. The system of claim 1, wherein the reflective loop system comprises reflective devices having respective reflective surfaces that are tilted with respect to each other, such that non-overlapping loops are formed.

8. The system of claim 1, wherein:
the partially coherent beam is in-coupled into the reflective loop system using a first optical device; and
the incoherent beam is out-coupled from the reflective loop system using a second optical device.

9. The system of claim 1, wherein the reflective loop system includes two field planes and two pupil planes.

10. The system of claim 1, wherein the reflective loop system further comprises:
a second reflective device associated with a field of the reflective loop system; and
a third reflective device associated with a pupil of the reflective loop system,
wherein a position of the field or the pupil is changed based on misalignment between respective reflective surfaces of the second and third reflective devices.

11. The system of claim 1, wherein the reflective loop system is configured such that after each loop a first portion of the incoherent beam is transmitted from the reflective loop system and a remaining portion of the incoherent beam is directed along another one of the loops.

12. The system of claim 1, wherein:
the incoherent beam is transmitted though one of a pupil or field of the reflective loop system; and
the at least partially coherent beam is received at the other one of the pupil or field of the reflective loop system.

13. The system of claim 1, further comprising:
a patterning device that patterns the incoherent beam; and
a projection system that projects the incoherent beam onto a target portion of a substrate.

14. The system of claim 13, further comprising:
an illumination system that processes the incoherent beam and directs the incoherent beam onto the patterning device.

15. The system of claim 14, wherein the illumination system comprises the radiation source and the reflective loop system.

16. The system of claim 1, wherein a path length the loop is larger than a temporal coherence length of the at least partially coherent beam.

17. The system of claim 1, further comprising:
one or more additional reflective loop systems that are configured to receive a respective incoherent beam from an upstream reflective loop system and reflect the incoherent beam through a loop to form another incoherent beam.

18. A lithography system, comprising:
an illumination system that generates an illumination beam of radiation, comprising,
a source of radiation, and
a reflective loop system comprising a reflective device comprising at least one opening,
wherein the reflective device is configured to reflect a partially coherent beam through one or more loops, each of the loops comprising four reflections, to form a more incoherent beam,
wherein the beam enters or exits the reflective loop system through the at least one opening;
a patterning device that patterns the illumination beam of radiation; and
a projection system that projects the patterned beam onto a target portion of a substrate.

19. The lithography system of claim 18, wherein the reflective loop system is configured such that after each loop a first portion of the incoherent beam is transmitted from the reflective loop system and a remaining portion of the incoherent beam is directed along another one of the loops.

20. The lithography system of claim 18, wherein the reflective loop system comprises the reflective device and one or more additional reflective devices having respective reflective surfaces that are tilted with respect to each other, such that non-overlapping loops paths are formed.

21. A device manufacturing method, comprising:
using a reflective loop system comprising a reflective device comprising at least one opening, wherein the reflective device is configured to reflect a coherent or partially coherent beam through one or more loops to form an incoherent beam, each of the loops comprising four reflections, wherein the beam enters or exits the reflective loop system through the at least one opening;
forming an illumination beam from the incoherent beam;
patterning the illumination beam; and
projecting the patterned illumination beam onto a target portion of a substrate.

22. The method of claim 21, wherein after each loop a first portion of the incoherent beam is formed into the illumination beam used in the forming and a remaining portion of the incoherent beam is directed along another one of the loops.

23. The method of claim 21, wherein the using step comprises tilting respective reflective surface of reflective devices with respect to each other to form non-overlapping loop paths.

24. A laser that outputs an incoherent output beam, comprising:
- a source of radiation that produces a coherent or partially coherent beam; and
- a reflective loop system comprising a reflective device comprising at least one opening,
- wherein the reflective device is configured to receive the coherent or partially coherent beam and reflect the partially coherent beam through one or more loops, each of the loops comprising four reflections, to form the incoherent output beam,
- wherein the beam enters or exits the reflective loop system through the at least one opening, and
- wherein the reflective loop system includes a field plane and a pupil plane.

25. The laser of claim 24, wherein the reflective loop system is configured such that after each loop a first portion of the incoherent beam is transmitted from the reflective loop system and a remaining portion of the incoherent beam is directed along another one of the loops.

26. The laser of claim 24, wherein the reflective loop system comprises the reflective device and one or more additional reflective devices having respective reflective surfaces that are tilted with respect to each other, such that non-overlapping loops paths are formed.

27. An illuminator that outputs an incoherent illumination beam, comprising:
- a source of radiation that produces a coherent or partially coherent beam; and
- a reflective loop system comprising a reflective device comprising at least one opening,
- wherein the reflective device is configured to receive the partially coherent beam and reflect the partially coherent beam through one or more loops, each of the loops comprising four reflections, to form the incoherent illumination beam,
- wherein the beam enters or exits the reflective loop system through the at least one opening, and
- wherein the reflective loop system includes a field plane and a pupil plane.

28. The illuminator of claim 27, wherein the reflective loop system is configured such that after each loop a first portion of the incoherent beam is transmitted from the reflective loop system and a remaining portion of the incoherent beam is directed along another one of the loops.

29. The illuminator of claim 27, wherein the reflective loop system comprises the reflective device and one or more additional reflective devices having respective reflective surfaces that are tilted with respect to each other, such that non-overlapping loops paths are formed.

* * * * *

UNITED STATES PATENT AND TRADEMARK OFFICE
CERTIFICATE OF CORRECTION

| | |
|---|---|
| PATENT NO. | : 7,728,954 B2 |
| APPLICATION NO. | : 11/447289 |
| DATED | : June 1, 2010 |
| INVENTOR(S) | : Baselmans et al. |

It is certified that error appears in the above-identified patent and that said Letters Patent is hereby corrected as shown below:

Title page, (73) Assignee section, after "ASML NETHERLANDS B.V., Veldhoven (NL)", please add --DAINIPPON SCREEN MFG. CO., LTD, Kyoto(JP)--

Signed and Sealed this
Twenty-ninth Day of May, 2012

David J. Kappos
*Director of the United States Patent and Trademark Office*